United States Patent
Hisada et al.

(10) Patent No.: US 10,468,496 B2
(45) Date of Patent: Nov. 5, 2019

(54) MANUFACTURING METHOD FOR SEMICONDUCTOR DEVICE HAVING AN OXIDATION-RESISTANT INSULATING FILM IN A TERMINATION REGION

(71) Applicant: Renesas Electronics Corporation, Koutou-ku, Tokyo (JP)

(72) Inventors: Kenichi Hisada, Ibaraki (JP); Koichi Arai, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/790,195

(22) Filed: Oct. 23, 2017

(65) Prior Publication Data

US 2018/0166554 A1 Jun. 14, 2018

(30) Foreign Application Priority Data

Dec. 9, 2016 (JP) ................. 2016-239283

(51) Int. Cl.
*H01L 29/66* (2006.01)
*H01L 29/06* (2006.01)
(Continued)

(52) U.S. Cl.
CPC .. *H01L 29/66068* (2013.01); *H01L 21/02236* (2013.01); *H01L 21/02255* (2013.01);
(Continued)

(58) Field of Classification Search
CPC ......... H01L 29/66068; H01L 21/02236; H01L 20/0619
See application file for complete search history.

(56) References Cited

U.S. PATENT DOCUMENTS 7,732,821 B2   6/2010   Suzuki et al.
2003/0067033 A1   4/2003   Kinoshita et al.
(Continued)

FOREIGN PATENT DOCUMENTS

JP   2002-093742 A   3/2002
JP   2013-098316 A   5/2013
(Continued)

OTHER PUBLICATIONS

Naoki, English translation of JP 2013098316 A, May 2013. (Year: 2013).*

(Continued)

*Primary Examiner* — Xia L Cross
(74) *Attorney, Agent, or Firm* — Shapiro, Gabor and Rosenberger, PLLC

(57) ABSTRACT

A semiconductor device includes: a first conductivity type semiconductor substrate made of silicon carbide; a second conductivity type body region in a device region of the semiconductor substrate; a first conductivity type source region formed in the body region; and a gate electrode formed on the body region through gate insulating films. The semiconductor device further includes, in a termination region of the semiconductor substrate, second conductivity type RESURF layers, and an edge termination region formed in the RESURF layers. Then, the RESURF layers and a front surface of the semiconductor substrate adjacent to the RESURF layers are covered by an oxidation-resistant insulating film.

6 Claims, 16 Drawing Sheets

(51) Int. Cl.

| | | |
|---|---|---|
| *H01L 29/16* | (2006.01) | |
| *H01L 23/31* | (2006.01) | |
| *H01L 29/78* | (2006.01) | |
| *H01L 21/04* | (2006.01) | |
| *H01L 21/02* | (2006.01) | |
| *H01L 23/29* | (2006.01) | |
| *H01L 29/739* | (2006.01) | |
| *H01L 29/51* | (2006.01) | |

(52) U.S. Cl.
CPC ...... *H01L 21/02271* (2013.01); *H01L 21/045* (2013.01); *H01L 21/049* (2013.01); *H01L 23/291* (2013.01); *H01L 23/3171* (2013.01); *H01L 29/0615* (2013.01); *H01L 29/0619* (2013.01); *H01L 29/0634* (2013.01); *H01L 29/0692* (2013.01); *H01L 29/1608* (2013.01); *H01L 29/7811* (2013.01); *H01L 29/063* (2013.01); *H01L 29/0696* (2013.01); *H01L 29/511* (2013.01); *H01L 29/518* (2013.01); *H01L 29/7395* (2013.01)

(56) References Cited

U.S. PATENT DOCUMENTS

| | | | | |
|---|---|---|---|---|
| 2006/0228860 | A1* | 10/2006 | Shinohara | H01L 27/105 438/257 |
| 2007/0278558 | A1* | 12/2007 | Koyama | H01L 21/26513 257/315 |
| 2010/0176455 | A1* | 7/2010 | Arayashiki | H01L 21/823842 257/369 |
| 2012/0171850 | A1 | 7/2012 | Honaga et al. | |
| 2014/0197422 | A1 | 7/2014 | Wada et al. | |
| 2014/0210008 | A1* | 7/2014 | Oritsuki | H01L 21/26513 257/362 |
| 2015/0380541 | A1 | 12/2015 | Arai et al. | |
| 2016/0197150 | A1 | 7/2016 | Ariyoshi et al. | |
| 2018/0019130 | A1* | 1/2018 | Chikamori | H01L 21/0465 |

FOREIGN PATENT DOCUMENTS

| | | |
|---|---|---|
| JP | 2016-009852 A | 1/2016 |
| WO | WO 2016/151829 A1 | 9/2016 |

OTHER PUBLICATIONS

Hideyo et al., English translation of JP 2002093742 A, Mar. 2002. (Year: 2002).*

Extended European Search Report dated May 17, 2018, in European Patent Application No. 17200145.5.

* cited by examiner

MANUFACTURING METHOD FOR SEMICONDUCTOR DEVICE HAVING AN OXIDATION-RESISTANT INSULATING FILM IN A TERMINATION REGION

CROSS-REFERENCE TO RELATED APPLICATION

The present application claims priority from Japanese Patent Application No. 2016-239283 filed on Dec. 9, 2016, the content of which is hereby incorporated by reference into this application.

TECHNICAL FIELD OF THE INVENTION

The present invention relates to a semiconductor device, and particularly to a technology effectively applied to a semiconductor device equipped with a silicon carbide substrate and a method of manufacturing the semiconductor device.

BACKGROUND OF THE INVENTION

A low ON-state resistance and a low switching loss are requested for a semiconductor power element besides a high withstand voltage. However, a currently prevailing primary silicon (Si) power element reaches logical performance limitations. Silicon carbide (SiC) has a dielectric breakdown electric field strength about one digit greater than Si. Therefore, element resistance can be reduced logically three digits or more by making a drift layer thin about 1/10 times for securing the withstand voltage and by increasing an impurity concentration about 100 times. In addition, an operation of SiC at a high temperature is also possible because a band gap of SiC is larger about 3 times than that of Si. Therefore, a SiC semiconductor element is expected to have excellent performance exceeding a Si semiconductor element.

By paying attention to merits of SiC, a DMOS (Double-Diffused MOSFET) is being studied and developed as a high withstand-voltage power MOSFET (Metal Oxide Semiconductor Field Effect Transistor).

Patent Document 1 (Japanese Patent Application Laid-open No. 2016-9852) discloses an example of a method of manufacturing the DMOS. Here, described are an element region 1A positioned in a center portion of a semiconductor chip, and a termination region 1B disposed on a peripheral portion of the semiconductor chip so as to surround the element region 1A.

SUMMARY OF THE INVENTION

The inventors of this application have examined a semiconductor device which includes a device region (element region) and a termination region. The termination region continuously surrounds a circumference (the entire circumference) of the device region, and is provided to secure a withstand voltage of the semiconductor device. The semiconductor device has been manufactured by the following method.

First, a semiconductor substrate (for example, an n-type semiconductor region) made of silicon carbide (SiC) is prepared. Next, a body region (for example, a p-type semiconductor region), a source region (for example, an n-type semiconductor region), and a body contact region (for example, a p-type semiconductor region) are formed in the device region in this order, and an edge termination region (for example, a p-type semiconductor region) and a RESURF layer (for example, a p-type semiconductor region) are formed in the termination region. Next, a front surface of the semiconductor substrate is oxidized in an oxide atmosphere at a high temperature to form a gate insulating film configured by (made of) a silicon oxide film, and then a gate electrode is formed on the gate insulating film.

According to the examining of the inventors of this application, it is found that the withstand voltage of the semiconductor device deteriorates due to a step of forming the above gate insulating film. In other words, the gate insulating film configured by the silicon oxide film is formed also in the termination region, but silicon oxide ($SiO_2$), carbon dioxide ($CO_2$), or carbon monoxide (CO) is formed when the surface of the semiconductor substrate made of silicon carbide (SiC) is oxidized. Most carbon dioxide ($CO_2$) or carbon monoxide (CO) volatilizes, but some carbon atoms are left without volatilizing to enter interstice in a lattice of silicon carbide (SiC), and become an interstitial carbon (referred to as "Ci"). The interstitial carbon (Ci) is charged negatively in an n-type semiconductor region and positively in a p-type semiconductor region. A donor concentration of the semiconductor substrate (for example, an n-type semiconductor region) or an acceptor concentration of the RESURF layer (for example, a p-type semiconductor region) seems to be increased. Along with this, it has been found out that a junction withstand voltage between the semiconductor substrate and the RESURF layer deteriorates, and the withstand voltage of the semiconductor device in the termination region deteriorates.

In Patent Document 1, the gate insulating film and a field insulating film are formed at the same time, and the polysilicon film in the termination region becomes a silicon oxide film at a time of forming the gate insulating film. Since the entire polysilicon film is oxidized, the surface of the semiconductor substrate is also oxidized in the termination region. Therefore, there is a possibility that the same problem as the above will arise.

The above and other objects and novel characteristics of the present invention will be apparent from the description of the present specification and the accompanying drawings.

The following is a brief description of an outline of the typical invention disclosed in the present application.

A semiconductor device according to an embodiment includes, in a termination region of a semiconductor substrate, a second conductivity type RESURF layer and an edge termination region formed in the RESURF layer. Then, the RESURF layer and a front surface of the semiconductor substrate closed to the RESURF layer are covered with an oxidation-resistant insulating film.

In addition, in a method of manufacturing a semiconductor device according to an embodiment, a gate insulating film is formed in a device region by oxidizing the semiconductor substrate in an oxide atmosphere under a state of covering, with the oxidation-resistant insulating film, the RESURF layer and the front surface of the semiconductor substrate closed to the RESURF layer in the termination region of the semiconductor substrate.

According to an embodiment of this application, it is possible to improve performance of the semiconductor device. In particular, it is possible to improve a withstand voltage of the semiconductor device.

BRIEF DESCRIPTIONS OF THE DRAWINGS

Figure 17:
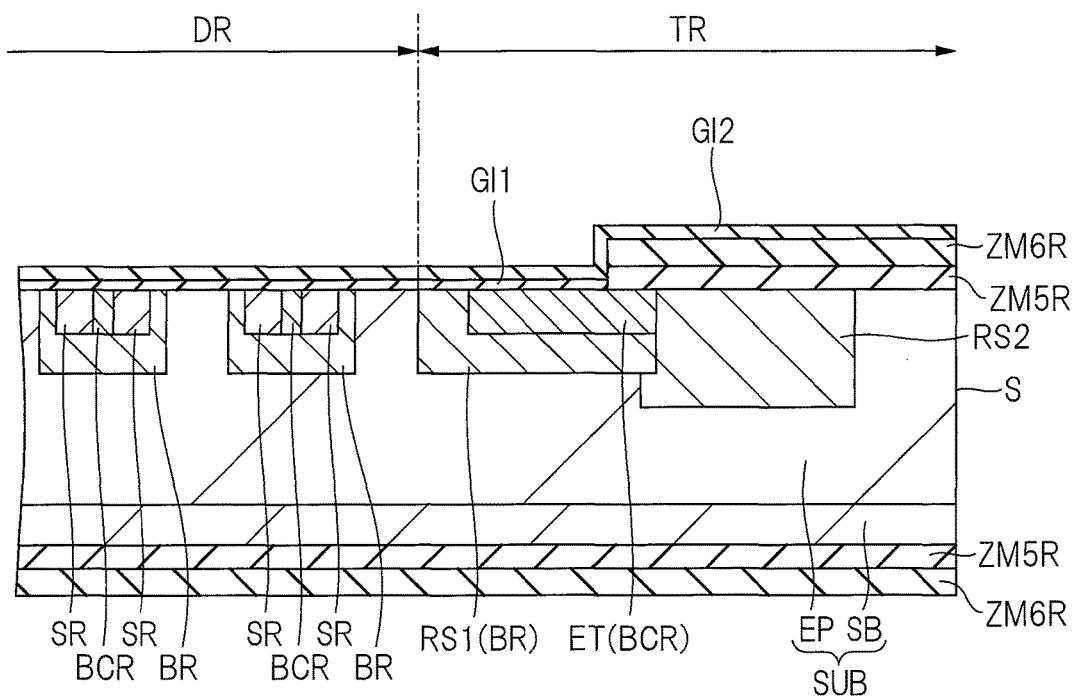
Figure 18:
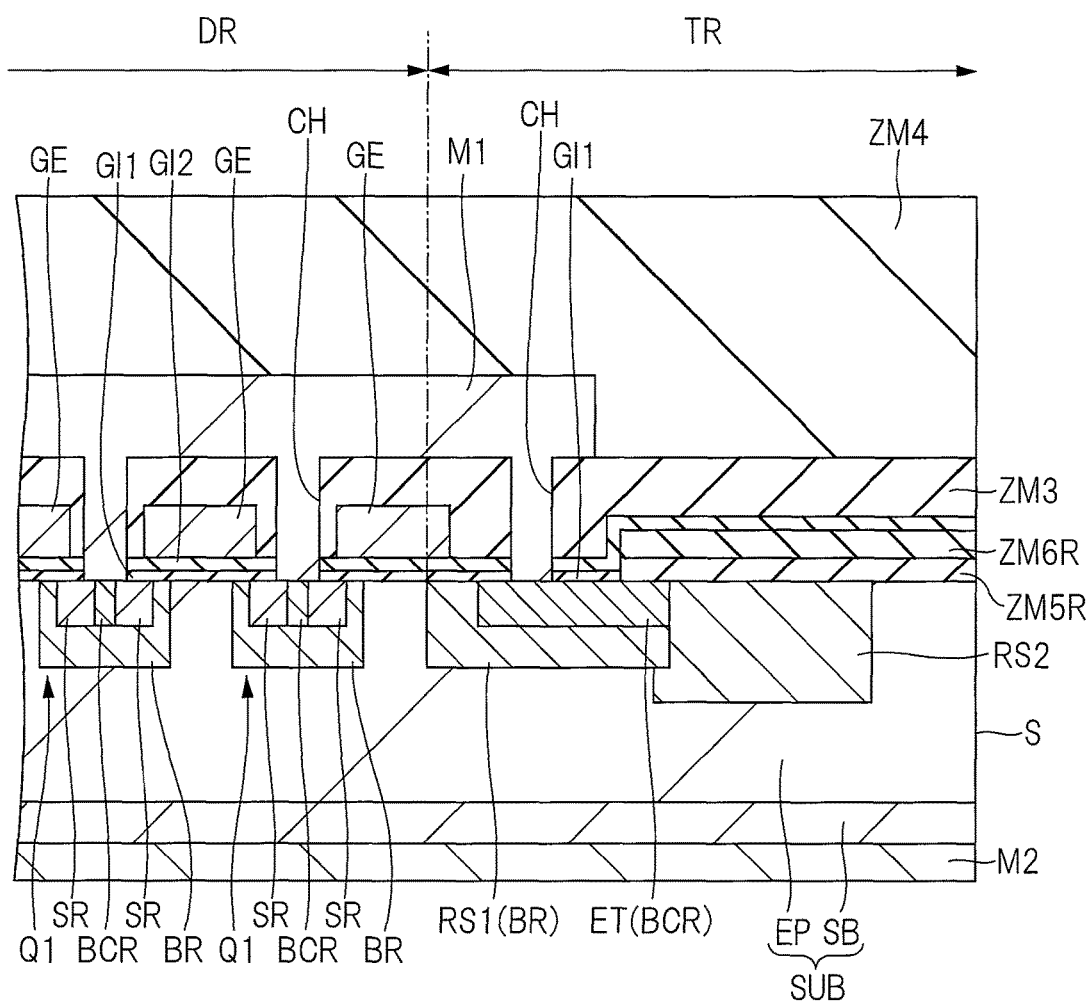
Figure 19:
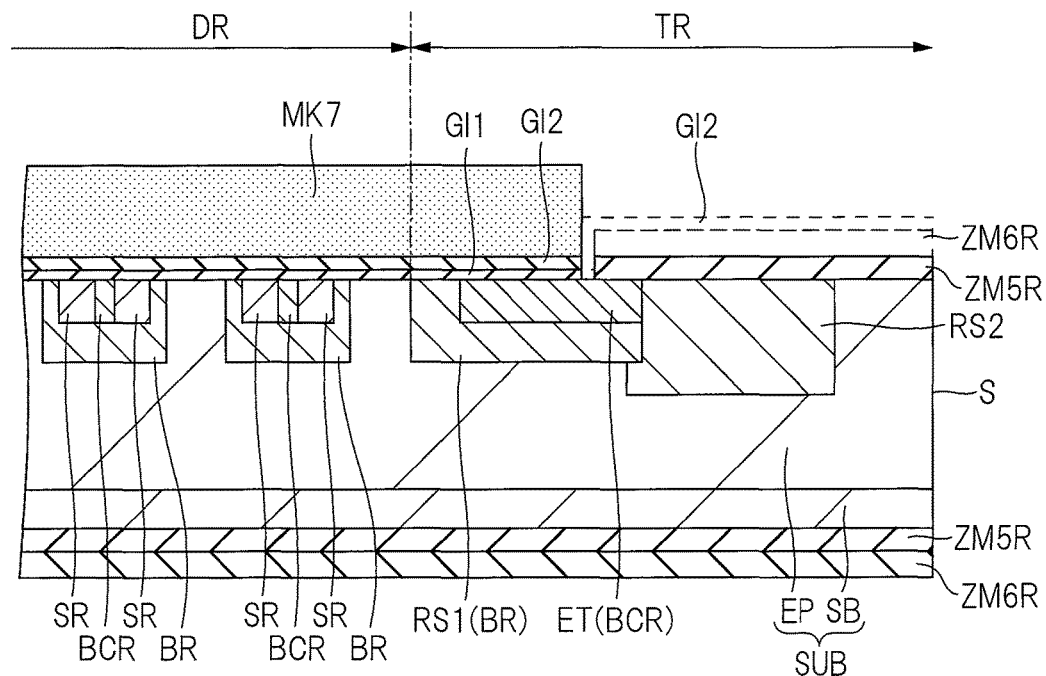
Figure 20:
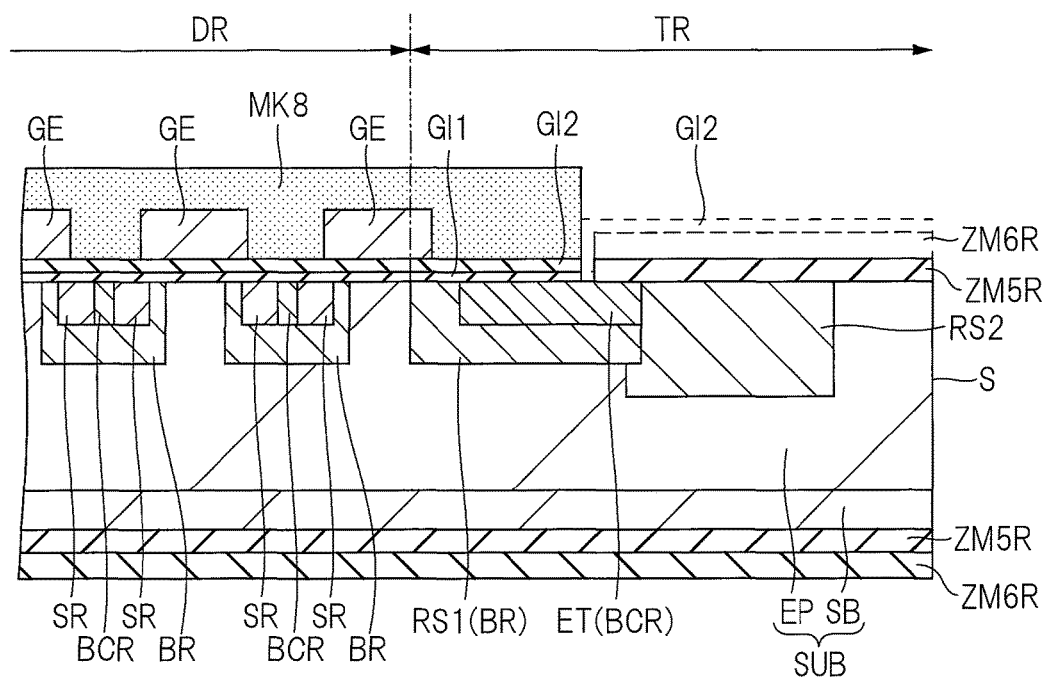
Figure 21:
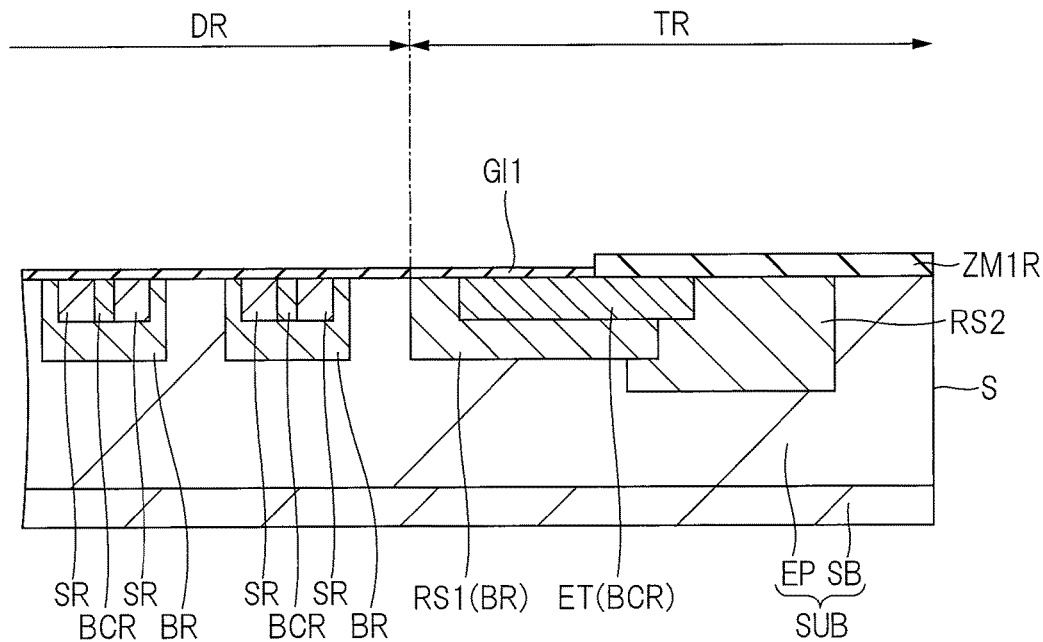
Figure 22:
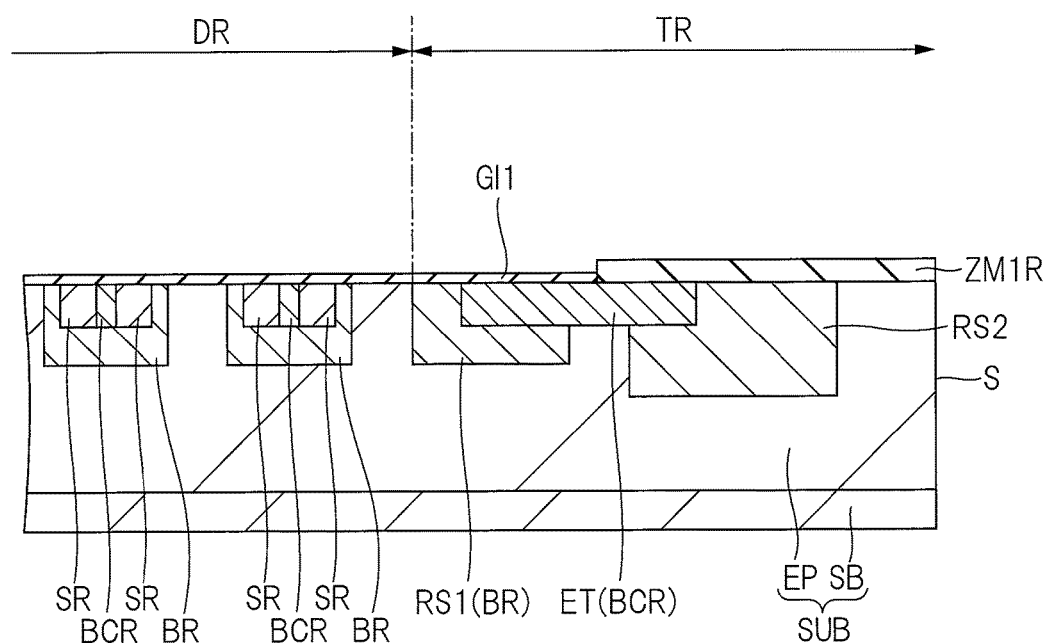
Figure 23:
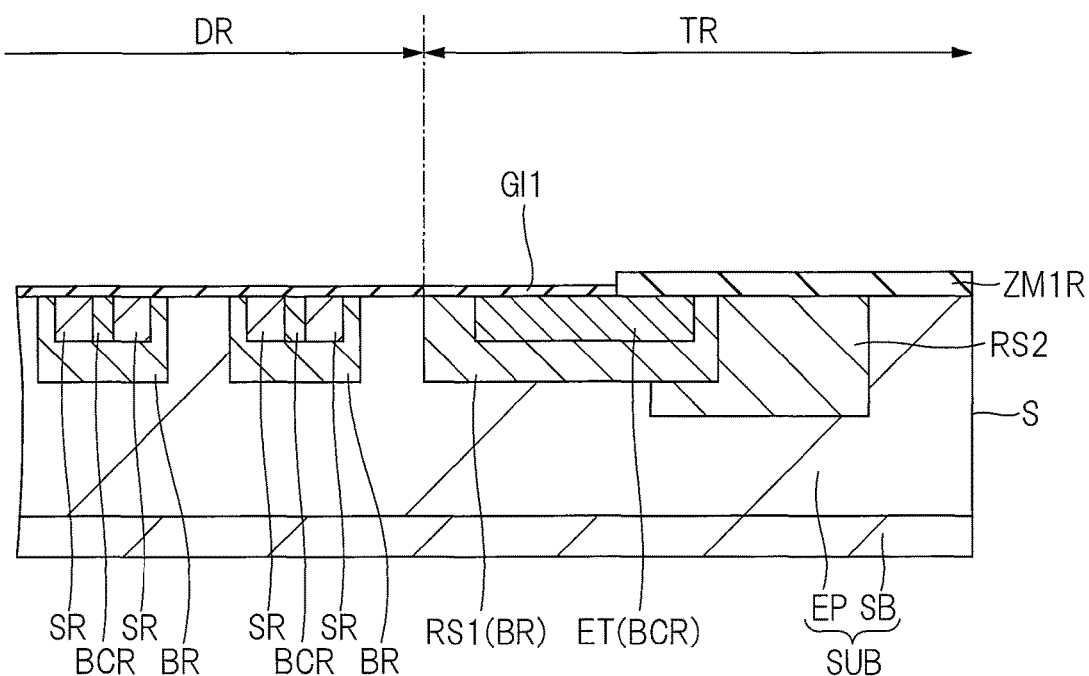
Figure 24:
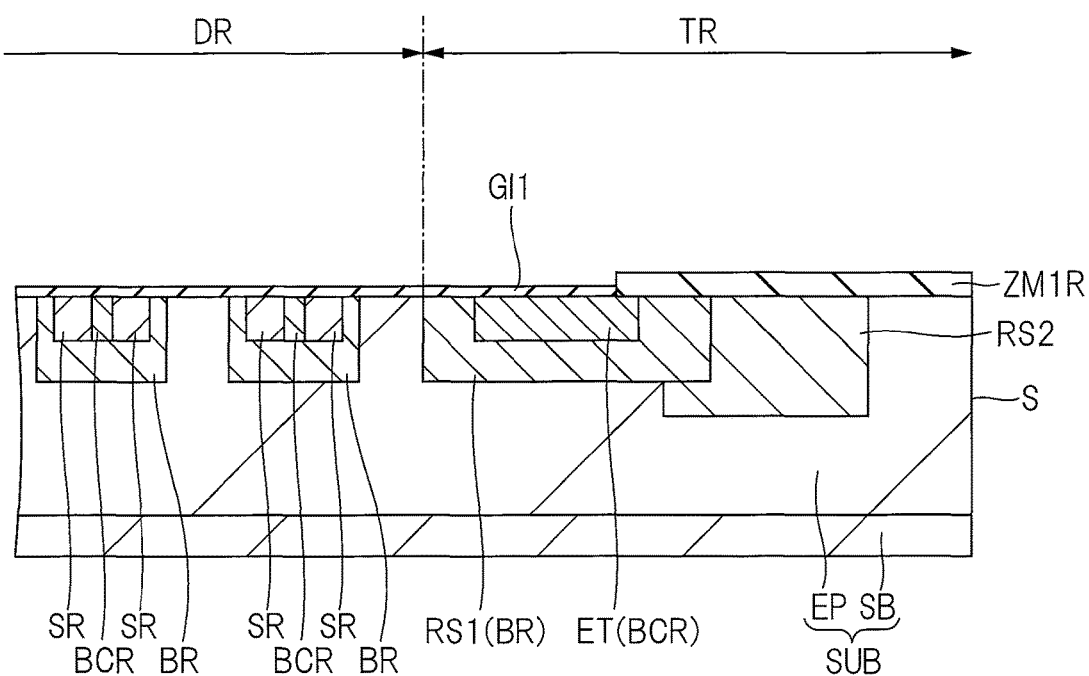
Figure 25:
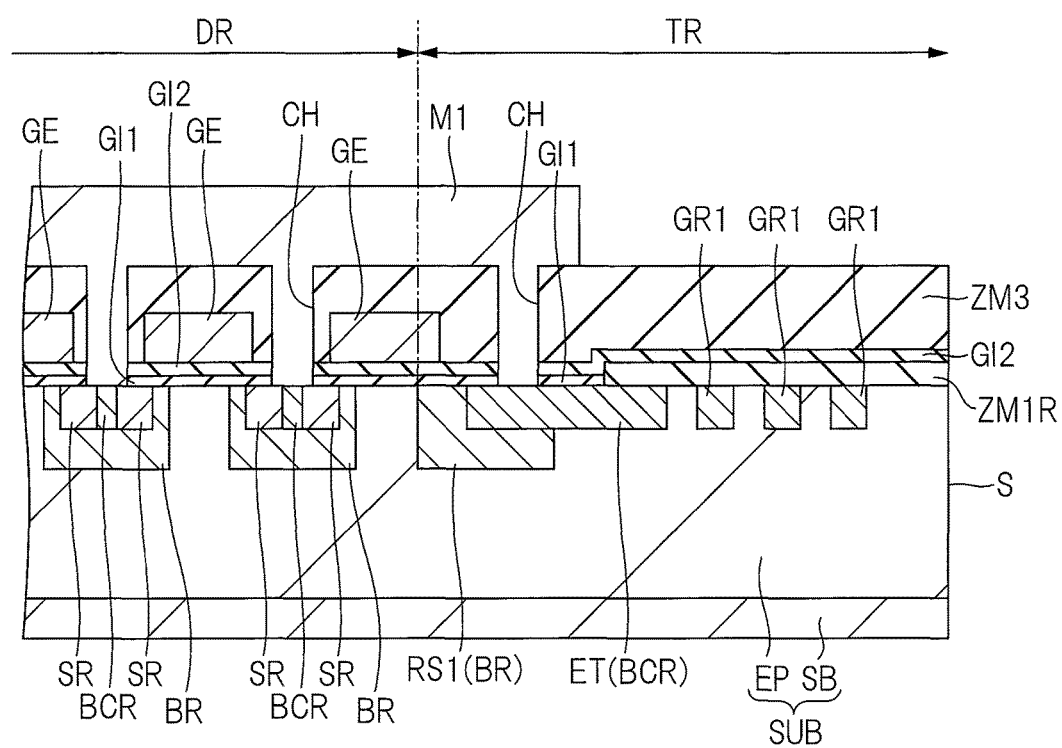
Figure 26:
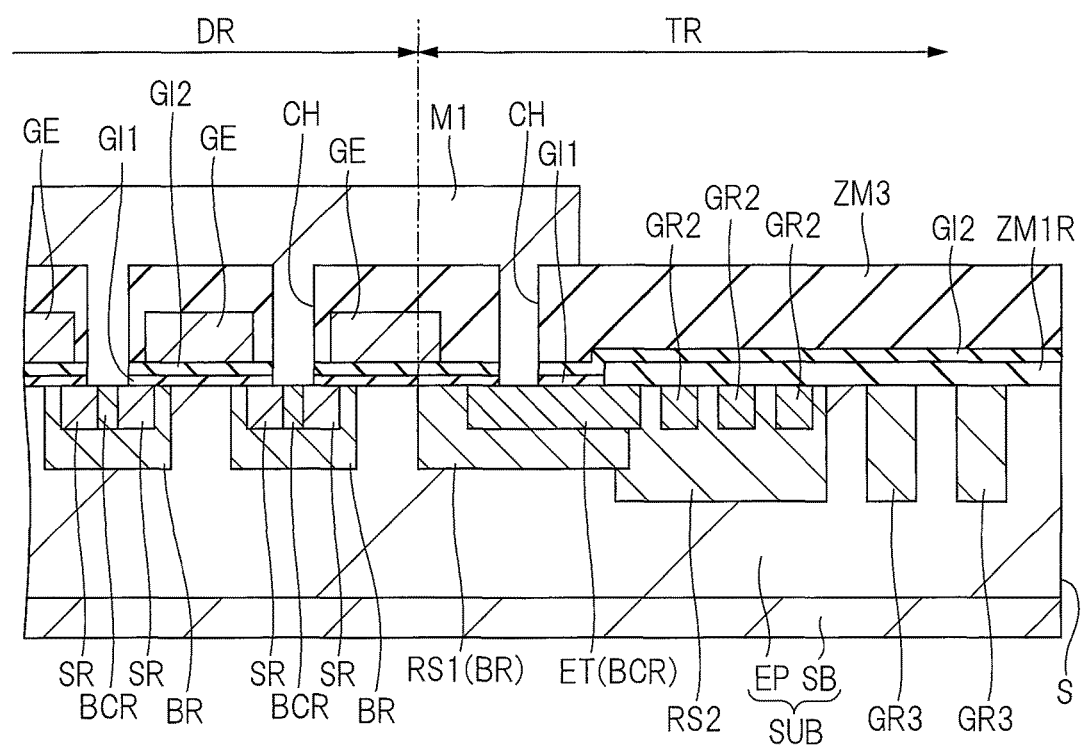

FIG. 17 a cross-sectional view illustrating a method of manufacturing a semiconductor device according to the second embodiment;

FIG. 18 is a cross-sectional view illustrating the method of manufacturing a semiconductor device according to the second embodiment;

FIG. 19 is a cross-sectional view illustrating a method of manufacturing a semiconductor device according to a three modification;

FIG. 20 is a cross-sectional view illustrating a method of manufacturing a semiconductor device according to a fourth modification;

FIG. 21 is a cross-sectional view illustrating a semiconductor device according to a fifth modification;

FIG. 22 is a cross-sectional view illustrating the semiconductor device according to the fifth modification;

FIG. 23 is a cross-sectional view illustrating the semiconductor device according to the fifth modification;

FIG. 24 is a cross-sectional view illustrating the semiconductor device according to the fifth modification;

FIG. 25 is a cross-sectional view illustrating a semiconductor device according to a sixth modification; and FIG. 26 is a cross-sectional view illustrating the semiconductor device according to the sixth modification.

DESCRIPTIONS OF THE PREFERRED EMBODIMENTS

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments. In addition, in the drawing(s) for explaining the embodiment(s), hatching may be used even in a plan view or a perspective view so as to make the drawings easy to see.

In addition, symbols "−" and "+" represent relative concentrations an impurity whose conductivity type is n-type or p-type. For example, in a case of the n-type impurity, impurity concentrations increase in order of "$n^{--}$", "$n^{-}$", "$n$", "$n^{+}$", and "$n^{++}$".

In addition, in this application, a substrate made of silicon carbide (SiC) will be simply referred to as a SiC substrate SB. In addition, in this application, an n-type SiC substrate SB and an epitaxial layer EP made of n-type silicon carbide (SiC) and formed on the SiC substrate SB are collectively referred to as a semiconductor substrate SUB. In other words, the semiconductor substrate SUB is made of silicon carbide (SiC). The impurity concentration of the SiC substrate SB is higher than that of the epitaxial layer EP.

(First Embodiment)

Figure 1:
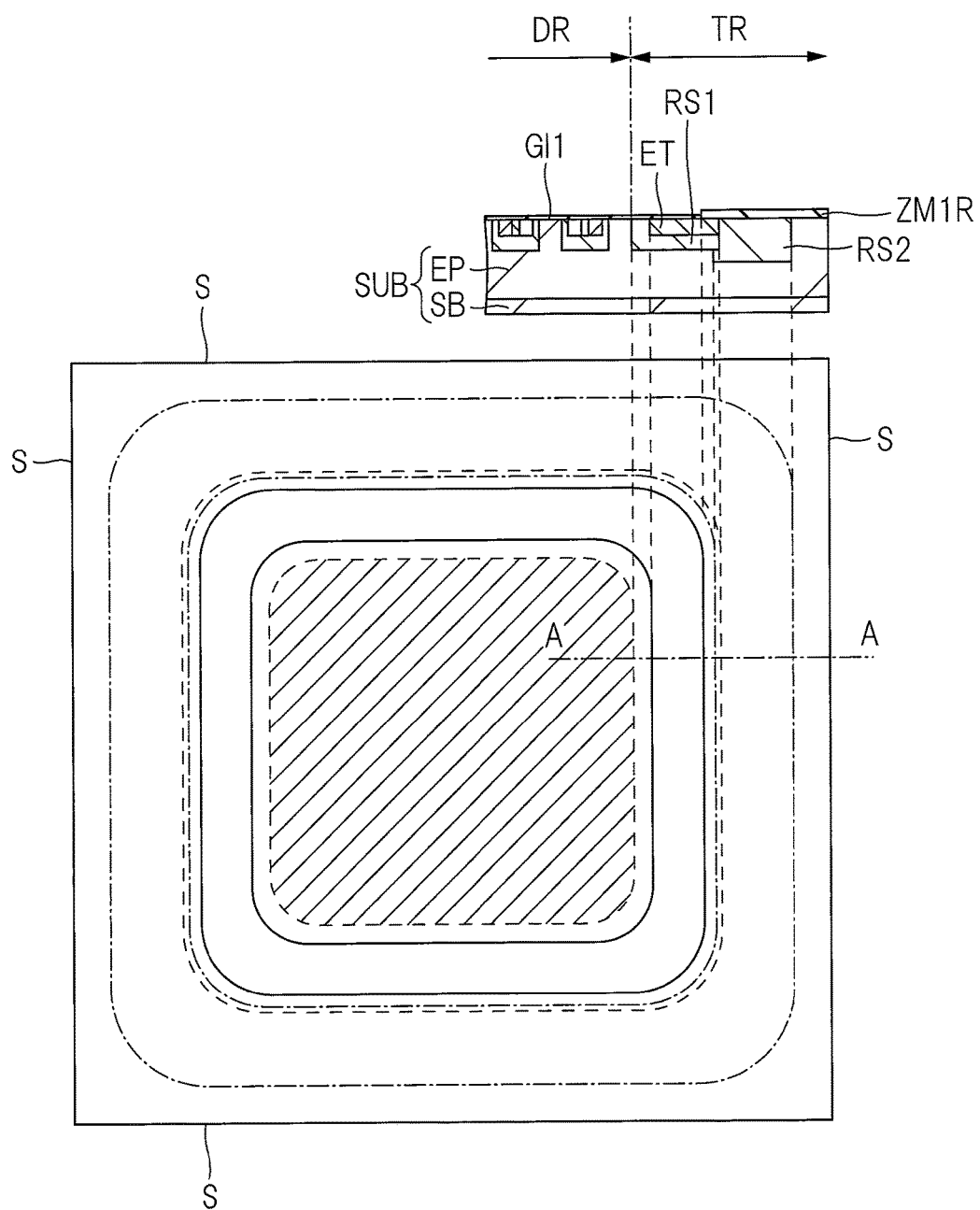
FIG. 1 is a plan view and a cross-sectional view about a semiconductor device of a first embodiment.
Figure 2:
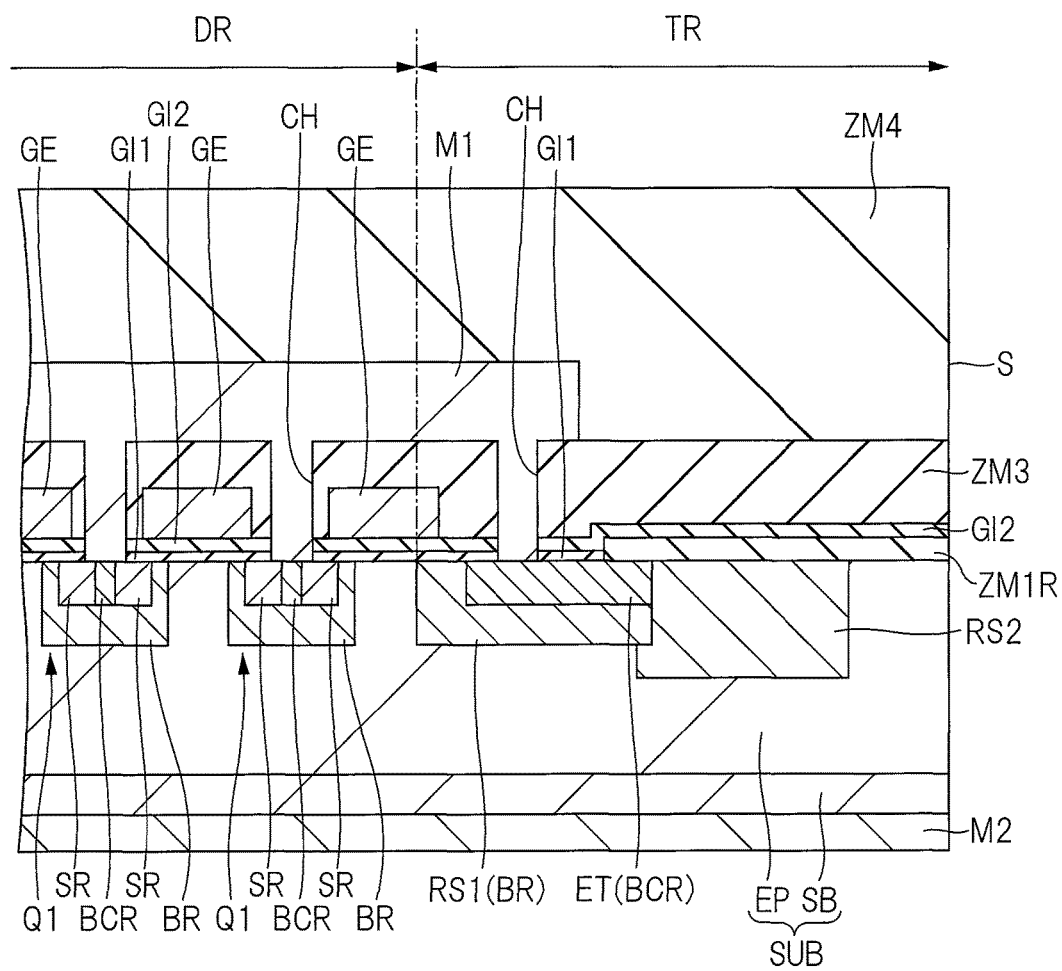
FIG. 2 is a cross-sectional view taken along line A-A of FIG. 1.

A semiconductor device of this embodiment will be described using FIGS. 1 and 2. FIG. 1 is a plan view and a cross-sectional view about the semiconductor device of this embodiment. Incidentally, the cross-sectional view of FIG. 1 illustrates a state of forming a gate insulating film GI1 in a method of manufacturing the semiconductor device described below. In the plan view, a device region DR is hatched. FIG. 2 is a cross-sectional view taken along line A-A of FIG. 1.

As illustrated in FIG. 1, the semiconductor device is formed in the semiconductor substrate SUB which is rectangular (square or oblong rectangular) in a plan view. The semiconductor substrate SUB has a principal surface and a rear surface, and the principal surface and the rear surface each have four sides S. In addition, the semiconductor substrate SUB has four side surfaces S. In a center portion of the principal surface, a device region DR is disposed, and a termination region TR is disposed to continuously surround a circumference of the device region DR. As described below, a gate electrode and a source electrode of a MOSFET (Metal Oxide Semiconductor Field Effect Transistor) are formed on the principal surface, and a drain electrode is formed on the rear surface.

As illustrated in FIG. 1, an edge termination region ET and RESURF (REduced SURface Field) layers RS1 and RS2 are formed on the principal surface of the semiconductor substrate SUB in the termination region TR. The edge termination region ET and the RESURF layers RS1 and RS2 are all provided to surround the circumference of the device region DR, and each have an annular shape with a desired width. The RESURF layer RS2 terminates inside (on a device region DR side of) the semiconductor substrate SUB with respect to its side S, and part of the semiconductor substrate SUB is exposed from outside (on aside S side of) the RESURF layer RS2. In other words, the circumference of the RESURF layer RS2 is surrounded by the side surfaces of the semiconductor substrate SUB.

In the termination region TR, an oxidation-resistant insulating film ZM1R is formed on the principal surface of the semiconductor substrate SUB, and the oxidation-resistant insulating film ZM1R covers the RESURF layer RS2, and the semiconductor substrate SUB present outside the RESURF layer RS2. The oxidation-resistant insulating film ZM1R covers the whole area of the RESURF layer RS2, and partially covers the edge termination region ET coming in contact with the RESURF layer RS2. The gate insulating film GI1 is formed on the principal surface of the semiconductor substrate SUB which is exposed from the oxidation-resistant insulating film ZM1R.

As illustrated in FIG. 2, formed in the device region DR is a MOSFET which is configured by connecting a plurality of MOSFETs Q1 in parallel. The MOSFET Q1 includes a source region, a drain region, and a gate electrode. The drain region is configured by an n-type semiconductor substrate SUB (that is, the SiC substrate and the epitaxial layer EP) which is an n-type semiconductor region. The source region SR is configured by an n-type semiconductor, and is formed in a body region BR which is a p-type semiconductor region. The gate electrode GE is formed on the body region BR between the source region SR and the semiconductor substrate SUB through a gate insulating film GI1 and a gate insulating film GI2. In other words, a front surface of the body region BR between the source region SR and the semiconductor substrate SUB is a channel formation region of the MOSFET Q1.

A body contact region BCR which is a p-type semiconductor region is formed in the body region BR, and the body contact region BCR comes in contact with and conducted to the body region BR. An upper surface and a side surface of the gate electrode GE are covered by an insulating film ZM3, and an electrode (source electrode) M1 is formed on the insulating film ZM3. A contact hole (opening) CH is formed in the insulating film ZM3 to expose the source region SR and the body contact region BCR, and the electrode M1 is formed even in the contact hole CH and comes in contact with the source region SR and the body contact region BCR. In other words, the electrode M1 is connected to the source region SR and the body contact region BCR. Then, an insulating film ZM4 is formed on the electrode M1. In addition, an electrode (drain electrode) M2 is formed in the rear surface of the semiconductor substrate SUB.

The termination region TR includes the edge termination region ET, the RESURF layers RS1 and RS2, and the semiconductor substrate SUB present outside (on the side surface S sides of) the RESURF layers RS1 and RS2. The edge termination region ET is a p-type semiconductor region, and its circumference (the side surface and a bottom surface) is covered by the RESURF layers RS1 and RS2 which are the p-type semiconductor regions (in a plan view and in a cross-sectional view). The impurity concentration of the edge termination region ET is higher than those of the RESURF layers RS1 and RS2, and the edge termination region ET is connected to the electrode M1. The RESURF layer is configured by the RESURF layer RS1 having a relatively high concentration and the RESURF layer RS2 having a relatively low concentration, and the RESURF layer RS2 is positioned outside (on a side surface S side of) the RESURF layer RS1. In addition, the RESURF layer RS2 has an overlapping portion with the RESURF layer RS1. The RESURF layers RS1 and RS2 have impurity concentrations different from each other, but may be formed by one semiconductor region.

In the termination region TR, the oxidation-resistant insulating film ZM1R is formed on the principal surface of the semiconductor substrate SUB. The oxidation-resistant insulating film ZM1R covers the RESURF layer RS2 and the semiconductor substrate SUB present outside the RESURF layer RS2, and reaches the side surface S. The oxidation-resistant insulating film ZM1R prevents oxidation of the principal surface of the RESURF layer RS2 and the principal surface of the semiconductor substrate SUB present outside the RESURF layer RS2, and thereby prevents formation of a silicon oxide film.

Incidentally, the gate insulating film GI1 is configured by a silicon oxide film formed by thermal oxide treatment, a silicon oxynitride film formed by oxynitride treatment, or a laminated film of these films. The gate insulating film GI2 is configured by a silicon oxide film formed by a CVD method. The gate electrode GE may be configured by a polycrystalline silicon film. The insulating film ZM3 may be configured by, for example, a silicon oxide film. The insulating film ZM4 may be configured by an organic insulation film such as polyimide.

In addition, the electrode M1 is configured by a metal film, and may be configured by a laminated film in which: aluminum (AlSi) containing aluminum (Al) or silicon (Si) is used as a main conductor film; and/or a barrier film such as titanium (Ti), titanium nitride (TiN), and tungsten nitride (TiW) is provided on and/or the main conductor film. The electrode M2 is configured by a metal film, and/or may be configured as a laminated film made of nickel silicide (NiSi)/titanium (Ti)/nickel (Ni)/gold (Au) in this order from a side near the rear surface.

In addition, the oxidation-resistant insulating film ZM1R may be configured by a silicon nitride film or a silicon oxynitride film.

Incidentally, a boundary between the device region DR and the termination region TR is set as a side surface of the RESURF layer RS1 on a device region DR side.

Next, a method of manufacturing the semiconductor device according to this embodiment will be described using FIGS. 3 to 12. FIGS. 3 to 12 are cross-sectional views illustrating a method of manufacturing the semiconductor device according to this embodiment. In the cross-sectional views illustrated by FIGS. 3 to 12, a region on a left side of each drawing illustrates the device region DR where the plurality of MOSFETs Q1 are formed, and a region on a right side of each drawing illustrates the termination region TR which is a circumferential region of the semiconductor substrate SUB.

Figure 3:
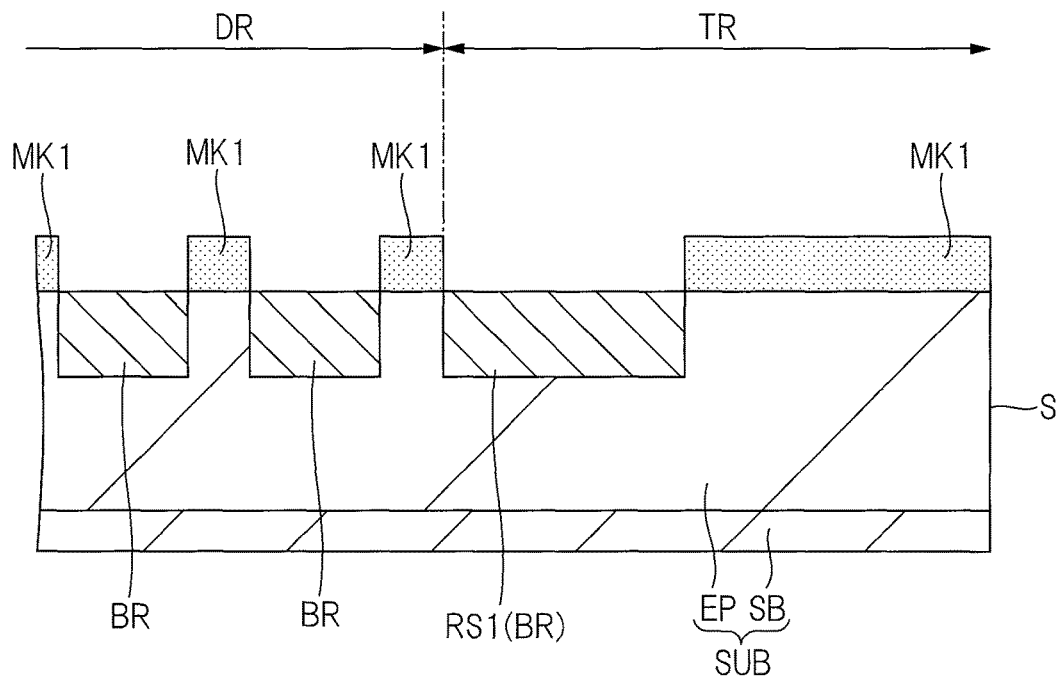
FIG. 3 is a cross-sectional view illustrating a method of manufacturing the semiconductor device of the first embodiment.

First, an n+-type SiC substrate SB is prepared as illustrated in FIG. 3. An n-type impurity is introduced into the SiC substrate SB with a high concentration. The n-type impurity is, for example, nitride (N), and has an impurity concentration of, for example, $1\times10^{19}$ cm$^3$.

Then, the epitaxial layer EP which is an n⁻-type semiconductor layer made of SiC is formed on the principal surface of the SiC substrate SB. The epitaxial layer EP contains an n-type impurity having an impurity concentration lower than that of the SiC substrate SB. The impurity concentration of the epitaxial layer EP depends on a rated withstand voltage of an element and is, for example, $1\times10^{16}$ cm$^{-3}$. The epitaxial layer EP serves as a path of a current flowing in a vertical direction of the MOSFET Q1 formed later. In other words, the epitaxial layer EP is a layer including a drift layer of the semiconductor device.

Then, a patterned mask film MK1 is formed on the principal surface of the epitaxial layer EP (in other words, the semiconductor substrate SUB). The mask film MK1 has such a pattern that as to expose a region for forming the body region BR and a region for forming the RESURF layer RS1 and to cover the other regions. The mask film MK1 is configured by, for example, a photoresist layer (photoresist film) etc.

Then, p-type impurities (for example, aluminum (Al)) are ion-injected to the epitaxial layer EP on whose upper portion the mask film MK1 is formed. Therefore, in the device region DR, a plurality of body regions (channel regions) BR which are p⁻-type semiconductor regions are formed alongside in a principal surface of the epitaxial layer EP exposed from the mask film MK1. A depth from the principal surface (front surface) of the epitaxial layer EP of the body region BR, that is, a junction depth does not reach a lower surface of the epitaxial layer EP.

In addition, the RESURF layer RS1 is formed in the termination region TR at the same time when the body regions BR are formed.

Figure 4:
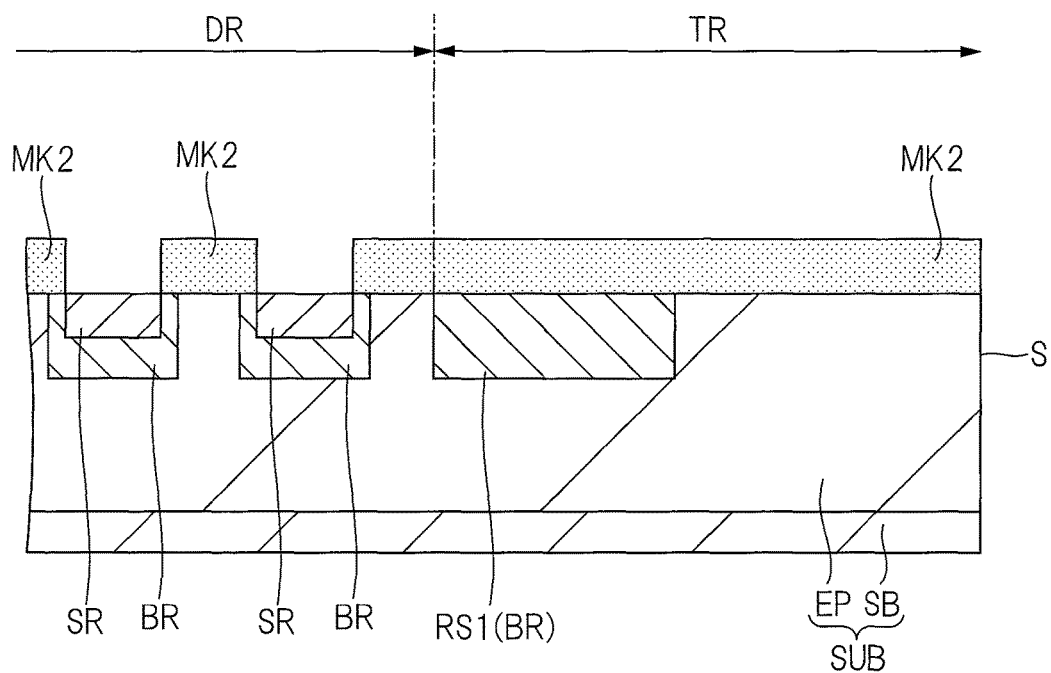
FIG. 4 is a cross-sectional view illustrating the method of manufacturing the semiconductor device subsequently to FIG. 3.

Next, source regions SR are formed in the device region DR as illustrated in FIG. 4. A patterned mask film MK2 is formed on the principal surface of the epitaxial layer EP (in other words, the semiconductor substrate SUB). The mask film MK2 exposes inner portions of the body regions BR in the device region DR, and covers parts of the body regions BR and the epitaxial layer EP disposed between the body regions BR. In addition, the mask film MK2 covers the termination region TR. The mask film MK2 is configured by, for example, a photoresist layer (photoresist film) etc.

Then, n-type impurities (for example, nitride (N)) are ion-injected to the upper surface of the epitaxial layer EP by using the mask film MK2 as a mask. Therefore, a plurality of source regions SR which are n+-type semiconductor regions are formed in the principal surface of the epitaxial layer EP. Each source region SR is formed in a center portion of the body region BR. In other words, in the principal surface of the epitaxial layer EP, the epitaxial layer EP having no body region BR and no source region SR exists between the adjacent body regions BR, and the body regions BR each having a width of about 0.5 μm are interposed between the epitaxial layer EP and each of the source regions SR. A depth of each source region SR from the principal surface of the epitaxial layer EP is shallower than that of each body region BR. An n-type impurity concentration of the source region SR is higher than that of the epitaxial layer EP.

Figure 5:
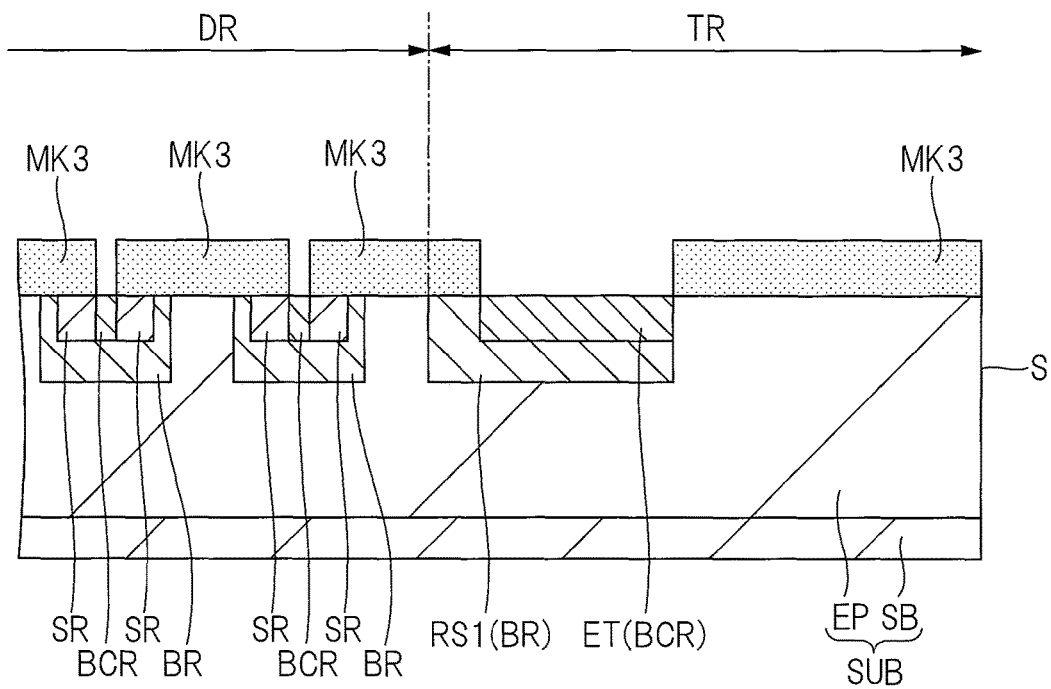
FIG. 5 is a cross-sectional view illustrating the method of manufacturing the semiconductor device subsequently to FIG. 4.

Next, as illustrated in FIG. 5, body contact regions BCR are formed in the device region DR, and an edge termination region ET is formed in the termination region TR. A patterned mask film MK3 is formed on the epitaxial layer EP. The mask film MK3 partially exposes inner portions of the body regions BR and the source regions SR in the device region DR. In addition, the mask film MK3 exposes an inner portion of the RESURF layer RS1 in the termination region TR and covers part of the RESURF layer RS1 and the principal surface of the semiconductor substrate SUB outside the RESURF layer RS1. The mask film MK3 is configured by, for example, a photoresist layer (photoresist film) etc.

Then, p-type impurities (for example, aluminum (Al)) are ion-injected, with a relatively high concentration, to the principal surface of the epitaxial layer EP exposed from the mask film MK3. Therefore, a plurality of body contact regions BCR which are p⁺-type semiconductor regions are formed on the principal surface of the epitaxial layer EP in the device region DR. Each body contact region BCR is formed in a center portion of each source region SR, that is, a center portion of each body region BR.

A depth of each body contact region BCR from the principal surface of the semiconductor substrate SUB is deeper than that of each source region SR, and reaches the body region BR. Incidentally, in a case where the body contact region BCR is disposed outside the source region SR, the depth may be shallower than that of each source region SR. In the drawing, each body contact region BCR is formed to be shallower than each body region BR. However, the depth of each body contact region BCR may be deeper than that of each body region BR. Each body contact region BCR is a region provided to electrically connect each body region BR and the electrode (source electrode) M1 in order to fix the body regions BR to a predetermined potential (source potential). In other words, the p-type impurity concentration of the body contact regions BCR is higher than the p-type impurity concentration of the body regions BR, and the body contact regions BCR and the body regions BR contact to each other.

At the same time as the forming of the body contact regions BCR, the edge termination region ET is formed in the termination region TR. The edge termination region ET is formed inside the RESURF layer RS1 to be shallower in depth than the RESURF layer RS1 and to have an impurity concentration higher than the RESURF layer RS1. A side surface (a side surface S side) of the edge termination region ET is matched to the side surface (on the side surface S side) of the RESURF layer RS1.

Figure 6:
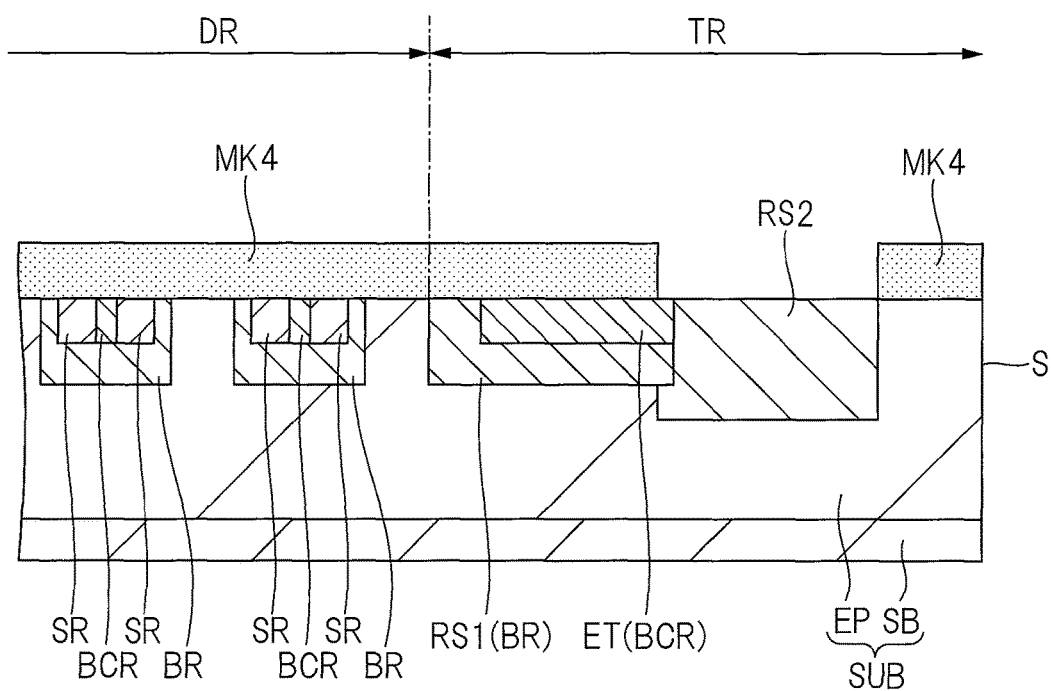
FIG. 6 is a cross-sectional view illustrating the method of manufacturing the semiconductor device subsequently to FIG. 5.

Next, the RESURF layer RS2 is formed in the termination region TR as illustrated in FIG. 6. A patterned mask film MK4 is formed on the epitaxial layer EP. The mask film MK4 covers the device region DR, and exposes, in the termination region TR, regions of the RESURF layer RS1 and the edge termination region ET on the side surface S side, and the principal surface of the semiconductor substrate SUB outside (on the side surface S side of) the RESURF layer RS1. The mask film MK4 is configured by, for example, a photoresist layer (photoresist film) etc.

Then, p-type impurities (for example, aluminum (Al)) are ion-injected to the epitaxial layer EP on which the mask film MK4 is formed. Then, the RESURF layer RS2 is formed in the termination region TR. The RESURF layer RS2 has a region which partially overlaps with the RESURF layer RS1 and the edge termination region ET. The impurity concentration of the RESURF layer RS2 is lower than the impurity concentration of the RESURF layer RS1. In addition, the depth of the RESURF layer RS2 is deeper than that of the RESURF layer RS1. However, the depth of the RESURF layer RS2 may be equal to or slightly shallower than that of the RESURF layer RS1. The RESURF layer RS2 does not reach the side surface S, and the semiconductor substrate SUB exists between the RESURF layer RS2 and the side surface S.

Next, after the mask film MK4 is removed, the entire principal surface of the semiconductor substrate SUB is covered with a protection film (for example, amorphous carbon film). An annealing treatment with high temperature (for example, 1700° C.) is performed onto the semiconductor substrate SUB, and the ion-injected impurities are activated. After the annealing treatment ends, the protection film is removed.

Figure 7:
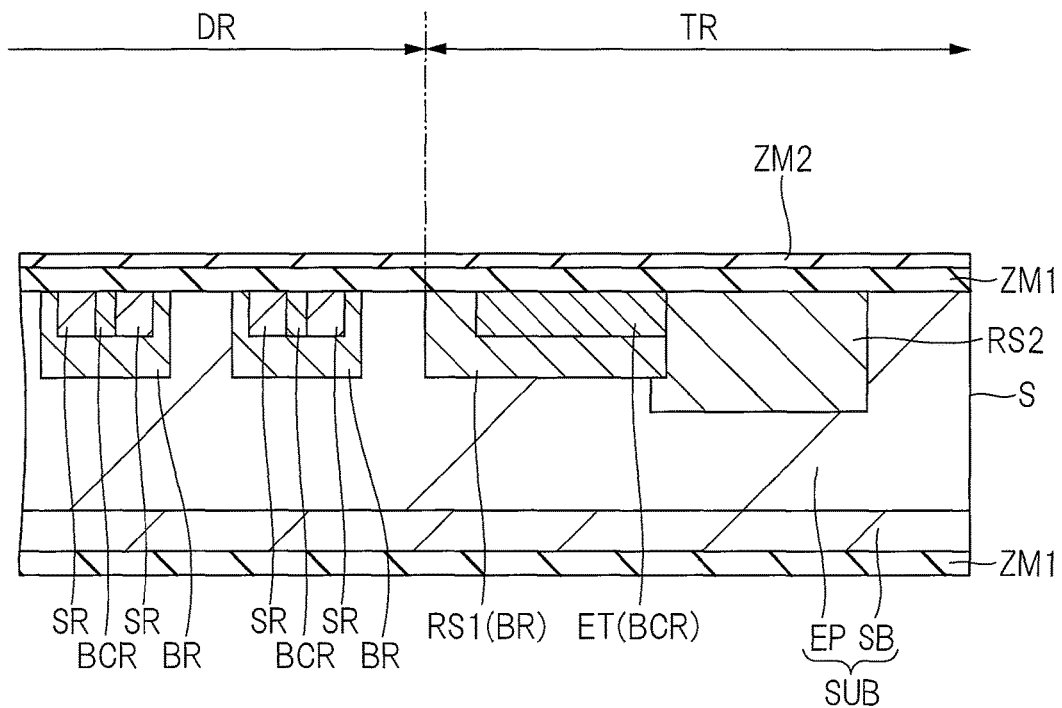
FIG. 7 is a cross-sectional view illustrating the method of manufacturing the semiconductor device subsequently to FIG. 6.

Next, insulating films ZM1 and ZM2 are formed to cover the entire principal surface of the semiconductor substrate SUB as illustrated in FIG. 7. The insulating film ZM1 is configured by a silicon nitride film having oxidation-resist properties, and its film thickness is set to, for example, 10 to 100 nm. Here, the insulating film ZM1 is preferably formed by an LPCVD (Low Pressure Chemical Vapor Deposition)

method. This is, for example, because the insulating film is denser and has higher oxidation-resist properties than a film formed by a P-CVD (Plasma-CVD) method. In other words, at the time of forming the gate insulating film GI1 described below, the insulating film ZM1 has a high effect of preventing the principal surface of the semiconductor substrate SUB from being oxidized in the termination region TR. Incidentally, in a case where the insulating film ZM1 is formed by the LPCVD method, the insulating film ZM1 is formed even on a rear surface side of the semiconductor substrate SUB. In addition, a silicon oxynitride film can also be used as the insulating film ZM1.

The insulating film ZM2 is configured by a silicon oxide film, and its film thickness is set to, for example, 50 to 100 nm. It is important that the insulating film ZM2 is formed only on a principal surface side of the semiconductor substrate SUB by a batch CVD method, and not formed on the rear surface side.

Figure 8:
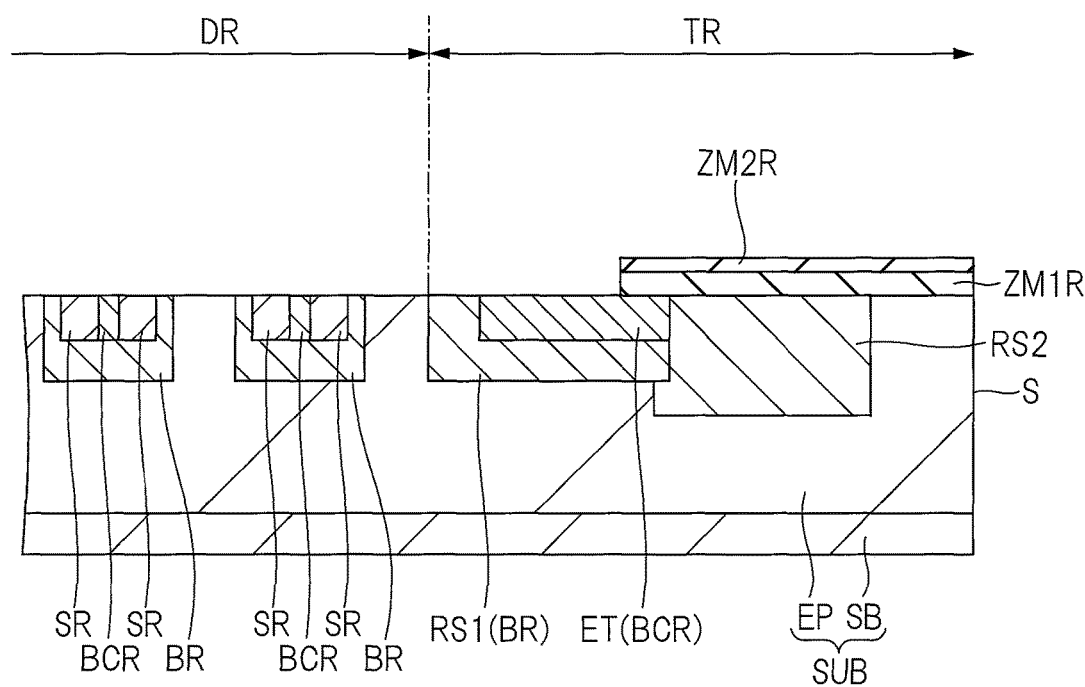
FIG. 8 is a cross-sectional view illustrating the method of manufacturing the semiconductor device subsequently to FIG. 7.

Next, an oxidation-resistant insulating film ZM1R is formed as illustrated in FIG. 8. The oxidation-resistant insulating film ZM1R covers the principal surface of the RESURF layer RS2 and the principal surface of the semiconductor substrate SUB outside (on the side surface S side of) the RESURF layer RS2 in the termination region TR. Further, the oxidation-resistant insulating film extends from the RESURF layer RS2 to the edge termination region ET in order to cover the whole area of the RESURF layer RS2.

Although not illustrated in the drawing, a mask film (for example, a photoresist layer) is formed on the insulating film ZM2 to cover a forming region of the oxidation-resistant insulating film ZM1R and to expose the other regions. Then, the insulating film ZM2 exposed from the mask film is removed by a dry etching method to form the insulating film ZM2R. At this time, it is important that the dry etching is ended while leaving the insulating film ZM1 in the region exposed from the mask film. Next, the insulating film ZM1 exposed from the mask film or the insulating film ZM2R is removed by, for example, a wet etching method using a hot phosphorus acid, and the oxidation-resistant insulating film ZM1R is formed. The principal surface of the semiconductor substrate SUB is exposed by the wet etching. In this way, since the insulating film ZM1 is removed by the wet etching method instead of the dry etching method, it is possible to prevent the principal surface of the semiconductor substrate SUB from being damaged. For example, in a case where the insulating film ZM1 is removed by the dry etching method to expose the principal surface of the semiconductor substrate SUB, the principal surface of the semiconductor substrate SUB is damaged by the dry etching. Therefore, film quality of the gate insulating film GI1 degrades, which becomes cause for a leakage current.

Incidentally, the insulating film ZM1 formed in the rear surface of the semiconductor substrate SUB can be removed by the wet etching treatment. Therefore, it is important that the insulating film ZM2 is formed by the batch CVD method, and the insulating film ZM1 is not covered by the insulating film ZM2 in the rear surface of the semiconductor substrate SUB.

Next, the insulating film ZM2R is removed with the oxidation-resistant insulating film ZM1R left. Incidentally, the insulating film ZM2R may be left instead of removing.

Figure 9:
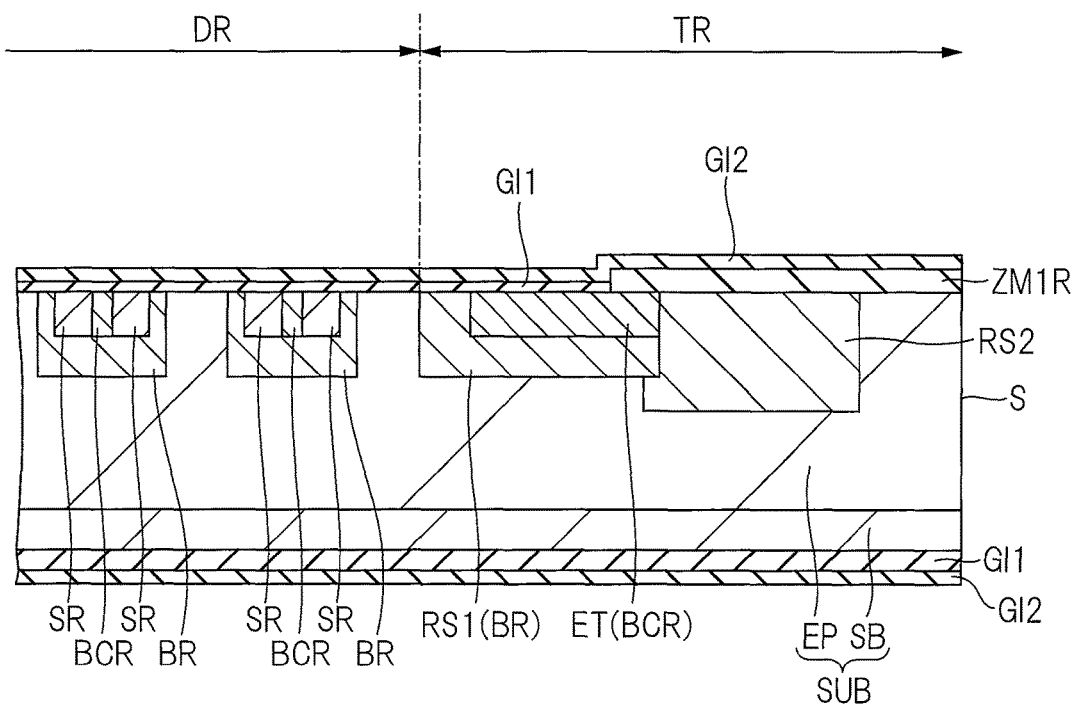
FIG. 9 is a cross-sectional view illustrating the method of manufacturing the semiconductor device subsequently to FIG. 8.

Next, the gate insulating films GI1 and GI2 are formed as illustrated in FIG. 9. The gate insulating film GI1 is configured by the silicon oxide film or the silicon oxynitride film, and its film thickness is set to, for example, 10 nm. The gate insulating film GI2 is a silicon oxide film formed by the CVD method, and the film thickness is 30 nm for example.

In a case where the gate insulating film GI1 is configured by a silicon oxide film, the semiconductor substrate SUB is thermally treated in an oxide atmosphere with, for example, 1100 to 1250° C. to form a thermal silicon oxide film. In addition, in a case where the gate insulating film GI1 is configured by the silicon oxynitride film, the silicon oxynitride film can be formed by thermally treating the thermal silicon oxide film in a nitrogen oxide atmosphere (NO or $NO_2$) after forming the above thermal silicon oxidant film. In addition, instead of forming the thermal silicon oxide film, the silicon oxynitride film may be formed by thermally treating the semiconductor substrate SUB at, for example, 1100 to 1250° C. in a nitrogen oxide atmosphere (NO or $NO_2$).

The gate insulating film GI1 is formed on the principal surface of the semiconductor substrate SUB exposed from the oxidation-resistant insulating film ZM1R. In other words, as illustrated in FIG. 9, the gate insulating film GI1 is formed in the whole area of the device region DR and part of the termination region TR. In a forming step of the gate insulating film GI1, the RESURF layer RS2 and the semiconductor substrate SUB existing between the RESURF layer RS2 and the side surface S are covered by the oxidation-resistant insulating film ZM1R in the termination region TR, so that the principal surfaces of both are not oxidized. Therefore, it is possible to prevent a junction withstand voltage between the semiconductor substrate SUB and the RESURF layer RS2 from being lowered without forming an interstitial carbon (Ci) between the RESURF layer RS2 and the semiconductor substrate SUB existing between the RESURF layer RS2 and the side surface S in the forming step of the gate insulating film GI1.

After forming the gate insulating film GI1, the gate insulating film GI2 is formed on the principal surface of the semiconductor substrate SUB, in other words, on the gate insulating film GI1 and the oxidation-resistant insulating film ZM1R by the CVD method. The gate insulating film is configured as a laminated structure of the thermal silicon oxide film or the silicon oxynitride film and the silicon oxide film made by the CVD method, so that the withstand voltage of the gate insulating film is secured. The semiconductor substrate SUB made of silicon carbide (SiC) is slower in a forming rate of the thermal silicon oxide film or the silicon oxynitride film than a semiconductor substrate made of silicon (Si), so that it is preferable to the above laminated structure. In addition, it is preferable that a film thickness of the silicon oxide film (the gate insulating film GI2) formed by the CVD method is made thicker than that of the thermal silicon oxide film or the silicon oxynitride film (GI1).

Incidentally, the gate insulating films GI1 and GI2 are formed also in the rear surface of the semiconductor substrate SUB as illustrated in FIG. 9.

Next, the film quality of the gate insulating films GI1 and GI2 may be improved by performing a thermal treatment onto the gate insulating films GI1 and GI2 at about 1000° C. in a nitride ($N_2$) atmosphere.

Figure 10:
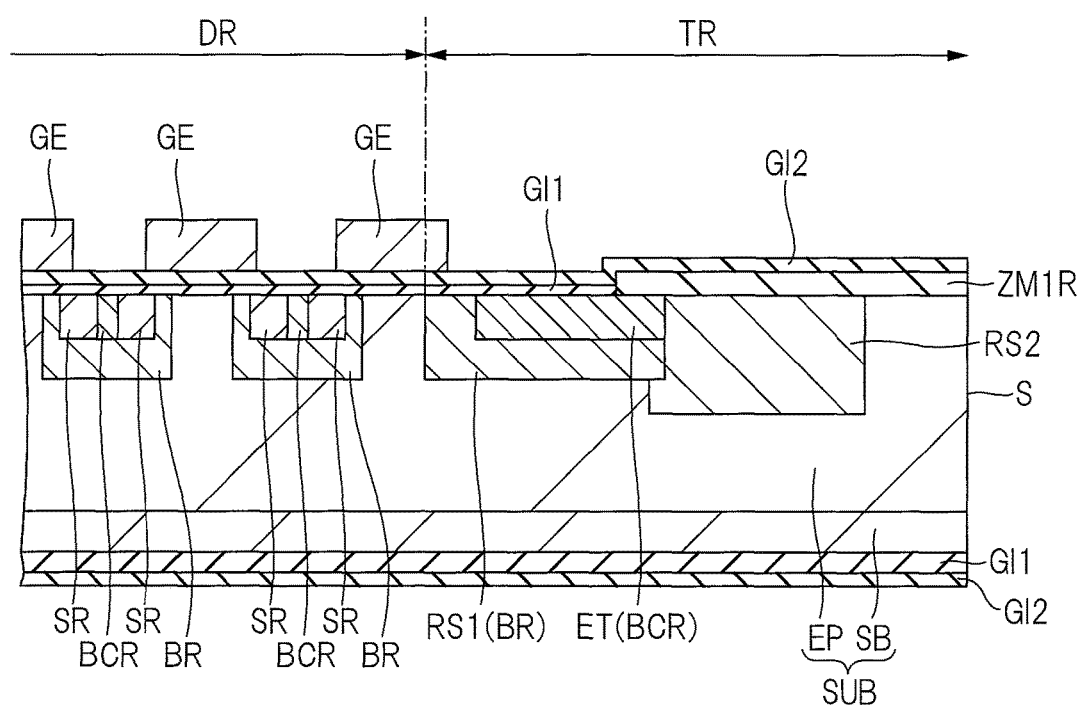
FIG. 10 is a cross-sectional view illustrating the method of manufacturing the semiconductor device subsequently to FIG. 9.

Next, a gate electrode GE is formed as illustrated in FIG. 10. The gate electrode GE is configured by, for example, a polysilicon film, and is formed with a desired pattern on the gate insulating films GI1 and GI2 in the device region DR. The gate electrode GE covers the front surface of the semiconductor substrate SUB between the body regions BR, and the front surface of the body region BR between each source region SR and the semiconductor substrate SUB through the gate insulating films GI1 and GI2. In addition, the gate electrode GE includes an overlapping part with each source region SR. In addition, although not illustrated in the drawing, a plurality of gate electrodes GE illustrated in FIG. 10 are connected (linked) to each other. In other words, the gate electrode GE is a sheet of plate-shape conductive film having a plurality of openings, each of which exposes part of the source region SR and the body contact region BCR.

Figure 11:
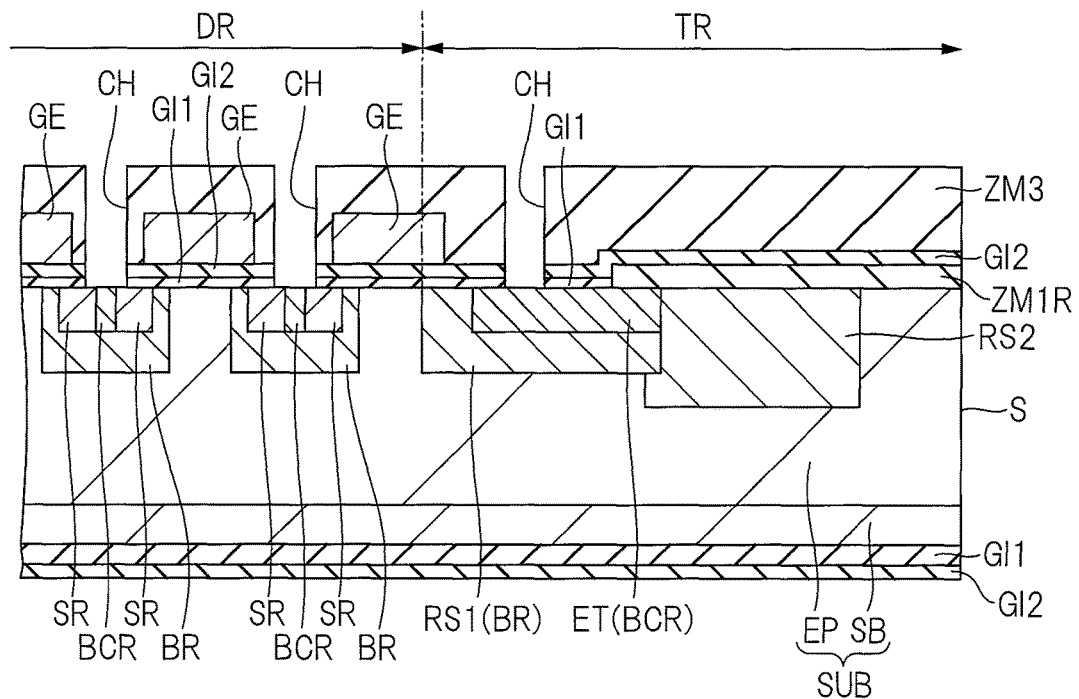
FIG. 11 is a cross-sectional view illustrating the method of manufacturing the semiconductor device subsequently to FIG. 10.

Next, an insulating film ZM3 is formed as illustrated in FIG. 11. The insulating film ZM3 is formed on the principal surface of the semiconductor substrate SUB, and covers the gate electrode GE and the gate insulating film GI2. The insulating film ZM3 is made of, for example, a silicon oxide which is formed using the CVD method.

Next, contact holes CH are formed in the insulating film ZM3 and the gate insulating films GI1 and GI2 as illustrated in FIG. 11. The contact holes CH in the device region DR expose part of each source region SR and the body contact region BCR, and the contact hole CH in the termination region TR exposes part of the edge termination region ET. Incidentally, although not illustrated in the drawing, a contact hole(s) is also formed to expose an upper surface of the gate electrode GE.

Then, although not illustrated in the drawing, a silicide layer may be formed on the body contact region BCR and the source region SR exposed from a bottom surface of the contact hole CH, and on an upper surface of the gate electrode GE by using a well-known salicide technology. The silicide layer is made of, for example, NiSi (nickel silicide).

Next, the principal surface of the semiconductor substrate SUB is covered with, for example, a photoresist layer, and the gate insulating films GI1 and GI2 formed on the rear surface are removed.

Figure 12:
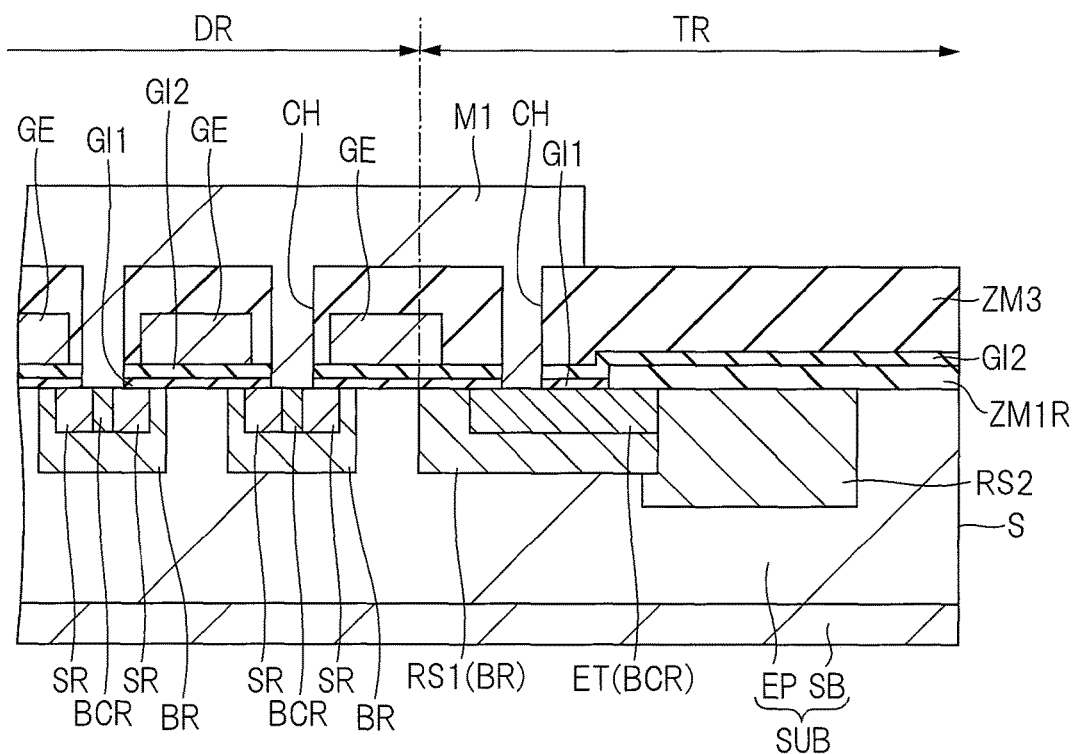
FIG. 12 is a cross-sectional view illustrating the method of manufacturing the semiconductor device subsequently to FIG. 11.

Next, an electrode (source electrode) M1 is formed on the principal surface of the semiconductor substrate SUB as illustrated in FIG. 12. The electrode M1 is formed on the insulating film ZM3, and is buried also in the contact hole CH. In other words, the electrode M1 comes into contact with the source regions SR and the body contact regions BCR in the device region DR, and comes into contact with the edge termination region ET in the termination region TR.

Next, an electrode (drain electrode) M2 is formed on the rear surface of the semiconductor substrate SUB as illustrated in FIG. 2. The electrode M2 is configured by, for example, a laminated film of nickel silicide (NiSi)/titanium (Ti)/nickel (Ni)/gold (Au). After a nickel silicide layer (NiSi) is formed on the rear surface of the semiconductor substrate SUB, titanium (Ti)/nickel (Ni)/gold (Au) are sequentially formed by a sputtering method etc.

Next, as illustrated in FIG. 2, an insulating film ZM4 configured by an organic insulation film such as a polyimide film is formed on the principal surface of the semiconductor substrate SUB to cover the electrode M1.

Through the above steps, the semiconductor device of this embodiment is completed.

Figure 13:
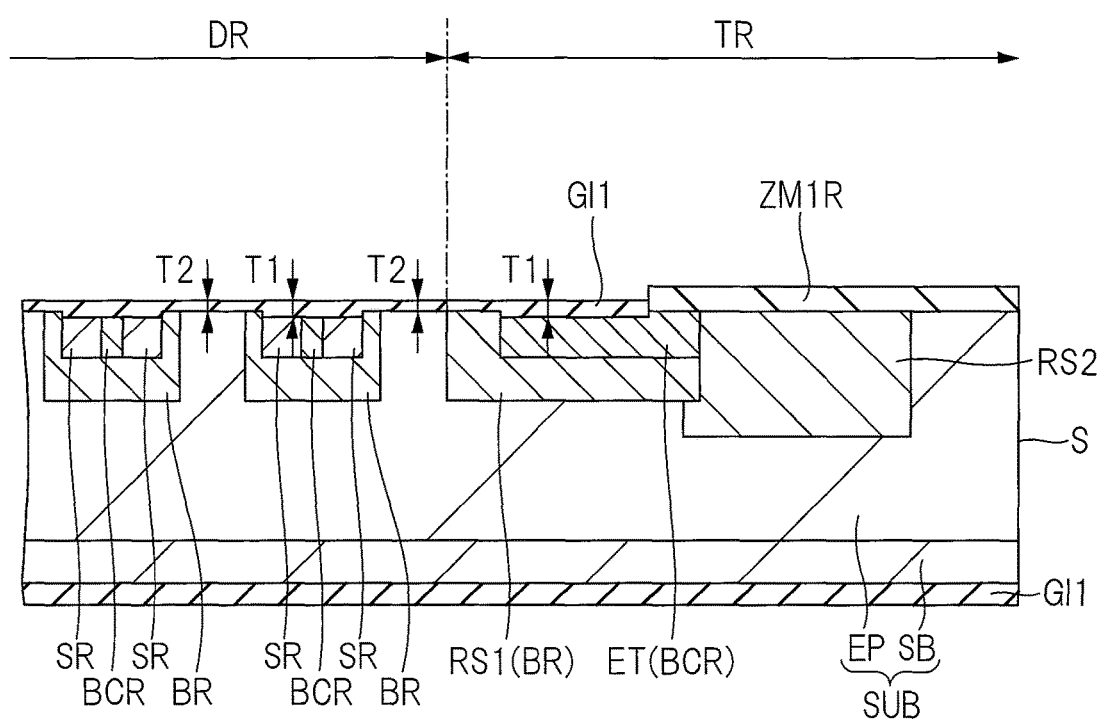
FIG. 13 is a cross-sectional view illustrating details of a gate insulating film of the first embodiment.

FIG. 13 is a cross-sectional view illustrating details of a gate insulating film of the first embodiment. FIG. 13 shows the gate insulating film GI1. In a case where the gate insulating film GI1 is formed by oxidizing or oxynitriding the principal surface of the semiconductor substrate SUB, the thick gate insulating film GI1 is formed on a high impurity concentration region in a semiconductor region formed in the principal surface of the semiconductor substrate SUB. In other words, the gate insulating film GI1 having a relatively thick film thickness T1 is formed on the front surfaces of each source region SR, each body contact region BCR, and the edge termination region ET. The gate insulating film GI1 having a relatively thin film thickness T2 is formed on the surfaces of the semiconductor substrate SUB, the body region BR, and the RESURF layer RS1. In other words, the film thickness T1 is thicker than the thickness T2. Therefore, a stepped portion is generated in the principal surface of the semiconductor substrate SUB, and a height of the principal surface of the semiconductor substrate SUB in a region where the thick gate insulating film GI1 is formed is lower than that of the principal surface of the semiconductor substrate SUB in a region where the thin gate insulating film GI1 is formed. In addition, since a region covered with the oxidation-resistant insulating film ZM1R and a region where the thick gate insulating film GI1 is formed are mixed in the edge termination region ET, the stepped portion is generated in the principal surface of the edge termination region ET. In other words, in the edge termination region ET, a height of the principal surface of the semiconductor substrate SUB in a region covered with the oxidation-resistant insulating film ZM1R is higher than that of the principal surface of the semiconductor substrate SUB in a region where the thick gate insulating film GI1 is formed. Here, the height is measured on the basis of the rear surface of the semiconductor substrate SUB.

<First Modification>

Figure 14:
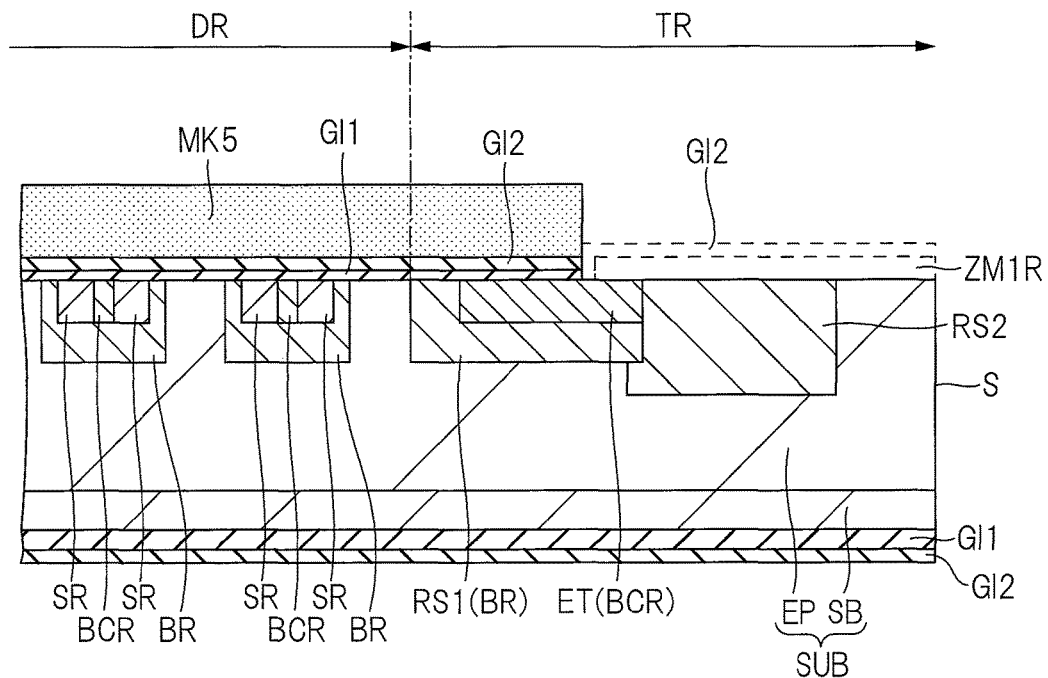
FIG. 14 is a cross-sectional view illustrating a method of manufacturing a semiconductor device according to a first modification.

A first modification is a modification of the first embodiment. FIG. 14 is a cross-sectional view illustrating a method of manufacturing the semiconductor device according to the first modification.

A step of removing the oxidation-resistant insulating film ZM1R is performed as illustrated in FIG. 14 after the step of forming the gate insulating film GI2 described using FIG. 9 in the above-described first embodiment. As illustrated in FIG. 14, a mask film MK5 configured by, for example, a photoresist layer is formed on the gate insulating film GI2. The mask film MK5 covers the device region DR, covers parts of the edge termination region ET and the RESURF layer RS1 in the termination region TR, and exposes the whole area of the oxidation-resistant insulating film ZM1R. In other words, an end portion (the side surface S side) of the mask film MK5 is positioned nearer to the device region DR side than an end portion (the device region DR side) of the oxidation-resistant insulating film ZM1R.

The gate insulating films GI1 and GI2 and the oxidation-resistant insulating film ZM1R exposed from the mask film MK5 are removed. Next, the mask film MK5 is removed. In FIG. 14, the removed gate insulating films GI1 and GI2 and the removed oxidation-resistant insulating film ZM1R are illustrated by a broken line.

In the first modification, the oxidation-resistant insulating film does without being left in the entire surface of the substrate, so that a warp amount of a wafer can be adjusted, and the manufacturing of a semiconductor device can be easily made.

<Second Modification>

Figure 15:
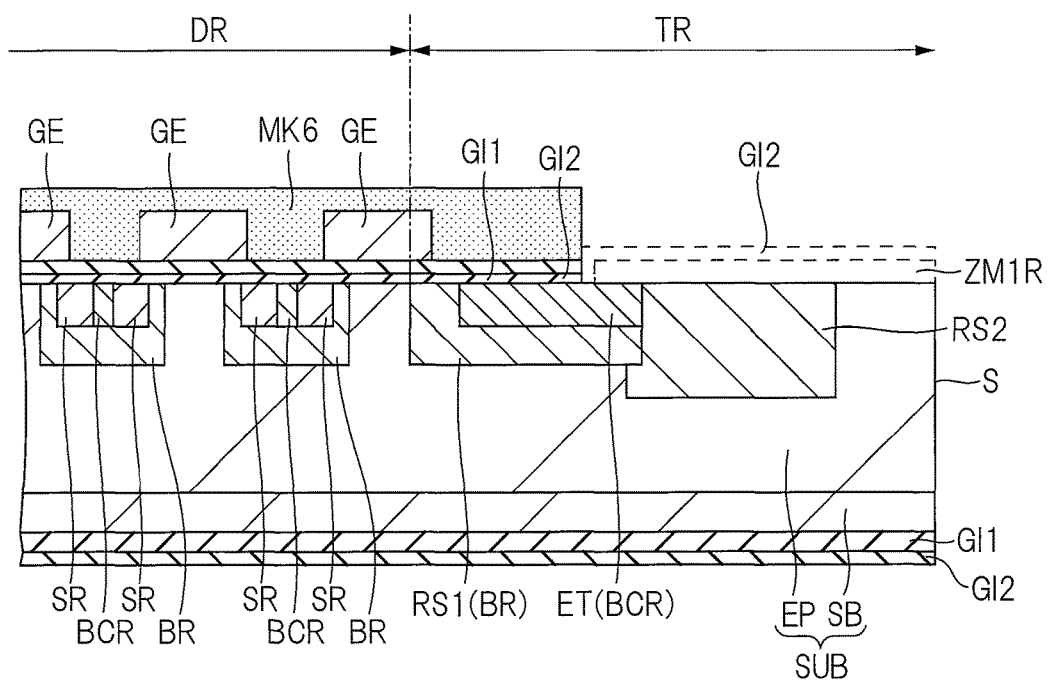
FIG. 15 is a cross-sectional view illustrating a method of manufacturing a semiconductor device according to a second modification.

A second modification is a modification of the first embodiment. FIG. 15 is a cross-sectional view illustrating a method of manufacturing a semiconductor device according to the second modification.

The first modification has described the example of removing the oxidation-resistant insulating film ZM1R after the step of forming the gate insulating film GI2 of the first embodiment. However, the second modification performs a step of removing the oxidation-resistant insulating film ZM1R after a step of forming the gate electrode GE described by using FIG. 10. A mask film MK6 is formed to cover the gate insulating film GI2 and the gate electrode as illustrated in FIG. 15. The mask film MK6 has a pattern equal to the pattern of the mask film MK5. Similarly to the first modification, the gate insulating films GI1 and GI2 and the oxidation-resistant insulating film ZM1R exposed from the mask film MK6 are removed. Next, the mask film MK6 is removed. Even in FIG. 15, the removed gate insulating films GI1 and GI2 and the removed oxidation-resistant insulating film ZM1R are each illustrated by a broken line.

In the second modification, it is possible to reduce a risk of damaging the front surface of the gate insulating film GI2 in the step of removing the mask film MK6 compared to the first modification.

(Second Embodiment)

Figure 16:
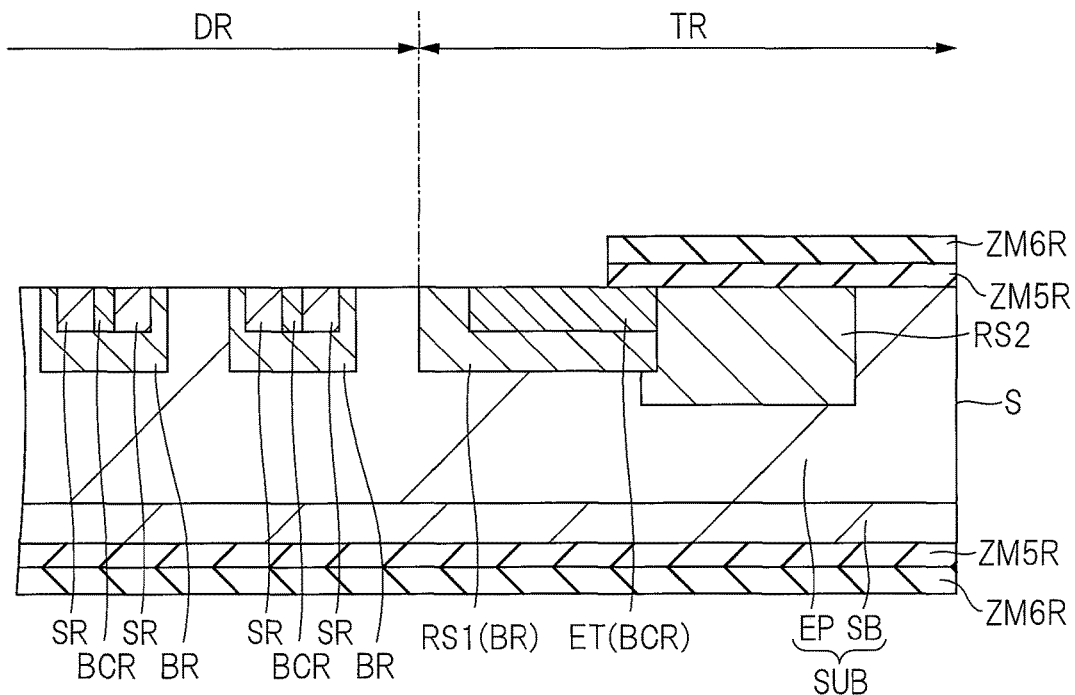
FIG. 16 is a cross-sectional view illustrating a method of manufacturing a semiconductor device according to the second embodiment.

A second embodiment is a modification of the first embodiment. FIGS. 16 to 18 are cross-sectional views illustrating a method of manufacturing the semiconductor device according to the second embodiment. FIGS. 16 and 17 correspond to FIGS. 8 and 9 of the first embodiment, and FIG. 18 corresponds to FIG. 2.

In FIG. 8 of the first embodiment, the oxidation-resistant insulating film ZM1R is formed on the semiconductor substrate SUB, and the insulating film ZM2R is formed thereon. However, in this second embodiment, the insulating film ZM5R is formed on the semiconductor substrate SUB, and an oxidation-resistant insulating film ZM6R is formed thereon. The insulating film ZM5R is a silicon oxide film formed by the CVD method, and the oxidation-resistant insulating film ZM6R is a silicon nitride film or a silicon oxynitride film.

Similarly to the first embodiment, the upper-layer oxidation-resistant insulating film ZM6R is formed by using the dry etching method, and the lower-layer insulating film ZM5R is formed by using the wet etching method.

Next, as illustrated in FIG. 17, the gate insulating films GI1 and GI2 are formed similarly to the first embodiment.

Further, as illustrated in FIG. 18, the steps of forming the gate electrode GE, the insulating film ZM3, the electrodes M1 and M2, and the insulating film ZM4 are performed similarly to the first embodiment, and thereby the semiconductor device of the second embodiment is completed.

According to this second embodiment, the insulating film ZM5R configured by a silicon oxide film is interposed between the oxidation-resistant insulating film ZM6R and the semiconductor substrate SUB. Therefore, it is possible to prevent defects from being generated on the principal surface of the semiconductor substrate SUB covered with the oxidation-resistant insulating film ZM6R in performing a thermal treatment at the time of forming the gate insulating film GI1. In other words, if the oxidation-resistant insulating film is directly formed on the principal surface of the semiconductor substrate SUB, a stress caused by a different between thermal expansion coefficients of the semiconductor substrate SUB and a silicon nitride film forming the oxidation-resistant insulating film is applied to the principal surface of the semiconductor substrate SUB. Therefore, there is a possibility of generating the defects.

<Third Modification>

A third modification is a modification of the second embodiment. FIG. 19 is a cross-sectional view illustrating a method of manufacturing a semiconductor device according to the third modification. The third modification corresponds to the first modification.

Even in the second embodiment, as illustrated in FIG. 19, the gate insulating films GI1 and GI2 and the oxidation-resistant insulating film ZM6R exposed from a mask film MK7 may be removed after forming the gate insulating film GI2. The insulating film ZM5R may be removed although FIG. 19 is an example of leaving it. The mask film MK7 has a pattern similar to that of the mask film MK5 of the first modification.

<Fourth Modification>

A fourth modification is a modification of the second embodiment. FIG. 20 is a cross-sectional view illustrating a method of manufacturing a semiconductor device according to the fourth modification. The fourth modification corresponds to the second modification.

Even in the second embodiment, as illustrated in FIG. 20, the gate insulating films GI1 and GI2 and the oxidation-resistant insulating film ZM6R exposed from a mask film MK8 may be removed after forming the gate electrode GE. The insulating film ZM5R may be removed although FIG. 20 is an example of leaving it. The mask film MK8 has a pattern similar to that of the mask film MK6 of the second modification.

<Fifth Modification>

A fifth modification is a modification of the first and second embodiments. FIGS. 21 to 24 are cross-sectional views of a semiconductor device according to the fifth modification. FIGS. 21 to 24 illustrate modifications about a positional relation between the edge termination region ET and the RESURF layers RS1 and RS2 in the termination region TR of the first or second embodiment. Hereinafter, a description will be given in comparison with the first embodiment.

In FIG. 21, the end portion (the side surface S side) of the edge termination region ET protrudes from the RESURF layer RS1.

FIG. 22 has a structure in which: the end portion (the device region DR side) of the edge termination region ET is surrounded by the RESURF layer RS1; and the end portion (the side surface S side) of the edge termination region ET is surrounded by the RESURF layer RS2. The RESURF layer RS2 is separated from the RESURF layer RS1.

FIG. 23 has a structure in which the RESURF layer RS1 surrounds the entire edge termination region ET. In other words, the end portion (the side surface S side) of the edge termination region ET is also surrounded by the RESURF layer RS1.

In FIG. 24, the RESURF layer RS2 is positioned outside the edge termination region ET, and both are separated from each other in comparison with FIG. 23.

In FIGS. 21 to 24, it is important that the RESURF layer RS2 disposed between the end portion (the side surface S side) of the edge termination region ET and the side surface S, and the semiconductor substrate SUB between the RESURF layer RS2 and the side surface S are covered with the oxidation-resistant insulating film ZM1R.

<Sixth Modification>

A sixth modification is a modification of the first and second embodiments. FIGS. 25 and 26 are cross-sectional views of a semiconductor device according to the sixth modification. FIGS. 25 and 26 illustrate modifications of the termination region TR of the first or second embodiment. Hereinafter, a description will be given in comparison with the first embodiment.

In FIG. 25, the end portion (the device region DR side) of the edge termination region ET is surrounded by the RESURF layer RS1, but a RESURF layer is not formed in the end portion (the side surface S side) of the edge termination region ET. Instead, a plurality of guard rings GR1 are formed between the edge termination region ET and the side surface S and at a predetermined interval therebetween. The guard ring GR1 is formed in the step of forming the edge termination region ET, and has the same impurity concentration.

In FIG. 25, it is important that the principal surface of the semiconductor substrate SUB and the guard rings GR1 existing between the edge termination region ET and the side surface S are covered with the oxidation-resistant insulating film ZM1R.

In FIG. 26, the end portion (the side surface S side) of the edge termination region ET protrudes from the RESURF layer RS1. Then, a plurality of guard rings GR2 are disposed in the RESURF layer RS2, and a plurality of guard rings GR3 are disposed between the RESURF layer RS2 and the side surface S.

The guard rings GR2 are formed in the step of forming the edge termination region ET, and has the same impurity concentration. In addition, the guard rings GR3 are formed in the step of forming the RESURF layer RS2, and has the same impurity concentration.

In FIG. 26, it is important that the RESURF layer RS2 and the guard rings GR2 disposed between the end portion (the side surface S side) of the edge termination region ET and the side surface S, and the principal surface of the semiconductor substrate SUB and the guard rings GR3 between the RESURF layer RS2 and the side surface S are covered with the oxidation-resistant insulating film ZM1R.

In the foregoing, the invention made by the inventors of the present invention has been concretely described based on the embodiments. However, it is needless to say that the present invention is not limited to the foregoing embodiments and various modifications and alterations can be made within the scope of the present invention.

Further, part of contents described in the above embodiments will be explained below.

[Note 1]

A semiconductor device includes:

a semiconductor substrate of a first conductivity type, the semiconductor substrate having a principal surface and a rear surface, being made of silicon carbide, and having, on the principal surface, a device region, a termination region surrounding a circumference of the device region, and a side positioned opposite the device region with respect to the termination region;

a first semiconductor region of a second conductivity type that is an opposite conductivity type to the first conductivity type, the first semiconductor region being formed on the principal surface of the semiconductor substrate in the device region;

a second semiconductor region formed inside the first semiconductor region and having the first conductivity type;

a gate electrode formed between the semiconductor substrate and the second semiconductor region and on the first semiconductor region through a gate insulating film;

an annular third semiconductor region formed on the principal surface of the semiconductor substrate in the termination region, having the second conductivity type, and surrounding the circumference of the device region in a plan view;

an annular fourth semiconductor region formed between the third semiconductor region and the side in the termination region, having the second conductivity type, and surrounding a circumference of the third semiconductor region in a plan view;

a first electrode formed on the principal surface of the semiconductor substrate, and connected to the first semiconductor region, the second semiconductor region, and the third semiconductor region; and a second electrode formed on the rear surface of the semiconductor substrate, wherein the semiconductor substrate comes in contact with the third semiconductor region in the principal surface, and includes an annular fifth semiconductor region surrounding the circumference of the third semiconductor region, the fourth semiconductor region is formed inside the fifth semiconductor region, and the fourth semiconductor region and the fifth semiconductor region between the third semiconductor region and the side are covered with an oxidation-resistant insulating film formed on the principal surface.

What is claimed is:

1. A method of manufacturing a semiconductor device, the method comprising:

(a) preparing a semiconductor substrate of a first conductivity type, the semiconductor substrate having a principal surface and a rear surface, being made of silicon carbide, and having, on the principal surface, a device region, a termination region surrounding a circumference of the device region, and a side positioned opposite the device region with respect to the termination region;

(b) forming first and second semiconductor regions in the semiconductor substrate in the device region, and annular third and fourth semiconductor regions in the termination region, the first semiconductor region having a second conductivity type that is an opposite conductivity type to the first conductivity type, the second semiconductor region having the first conductivity type positioned inside the first semiconductor region, the third semiconductor region having the second conductivity type and surrounding the circumference of the device region in plan view, and the fourth semiconductor region having the second conductivity type, being positioned within the third semiconductor region, and surrounding the circumference of the device region in plan view;

(c) forming a first oxidation-resistant insulating film over the principal surface of the semiconductor substrate in the termination region and a second oxidation-resistant insulating film directly contacting the rear surface of the semiconductor substrate;

(d) forming a first gate insulating film on the principal surface of the semiconductor substrate in the device region by using the first oxidation-resistant insulating film as a mask;

(e) forming a gate electrode over the first gate insulating film; and (f) forming, over the gate electrode through a first insulating film, a first electrode connected to the first semiconductor region, the second semiconductor region, and the fourth semiconductor region, wherein an impurity concentration of the third semiconductor region is lower than that of the fourth semiconductor region, the semiconductor substrate comes in contact with the third semiconductor region in the principal surface, and includes an annular fifth semiconductor region surrounding a circumference of the third semiconductor region, in (d), the third semiconductor region and the fifth semiconductor region are covered with the first oxidation-resistant insulating film, in (c), the first oxidation-resistant insulating film and the second oxidation-resistant insulating film are formed by low-pressure chemical vapor deposition, and the second oxidation-resistant insulating film is removed from the rear surface by wet etching, and in (d), the semiconductor substrate is thermally treated in an atmosphere containing oxygen and nitrogen to form the first gate insulating film, which is a silicon oxynitride film.

2. The method of manufacturing the semiconductor device according to claim 1, further comprising:
(g) after (d) and before (e), forming a second gate insulating film on the first gate insulating film by using a CVD method.

3. The method of manufacturing the semiconductor device according to claim 1,
wherein (c) includes:
(c-1) depositing a silicon nitride film and a silicon oxide film sequentially on the principal surface of the semiconductor substrate;
(c-2) performing an anisotropic dry etching of the silicon oxide film to remove the silicon oxide film in the device region and to leave the silicon oxide film in the termination region; and
(c-3) performing a wet etching of the silicon nitride film to remove the silicon nitride film exposed from the silicon oxide film.

4. The method of manufacturing the semiconductor device according to claim 1, further comprising:
(h) forming a second electrode on the rear surface of the semiconductor substrate after (f).

5. The method of manufacturing the semiconductor device according to claim 1, further comprising:
(i) removing the first oxidation-resistant insulating film between (d) or (e) and (f).

6. The method of manufacturing the semiconductor device according to claim 1, wherein a first thickness of portions of the first gate insulating film formed on the first, second, and fourth semiconductor regions is greater than a second thickness of other portions of the first gate insulating film formed on the principal surface of the semiconductor substrate in the device region.

* * * * *